United States Patent
Tombs et al.

(10) Patent No.: US 11,404,589 B2
(45) Date of Patent: *Aug. 2, 2022

(54) OPEN ELECTRODES FOR IN-PLANE FIELD GENERATION

(71) Applicant: Eastman Kodak Company, Rochester, NY (US)

(72) Inventors: Thomas Nathaniel Tombs, Rochester, NY (US); Todd Mathew Spath, Hilton, NY (US); Christopher B. Liston, Rochester, NY (US); Douglas Edward Garman, Webster, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 195 days.

This patent is subject to a terminal disclaimer.

(21) Appl. No.: 16/106,059

(22) Filed: Aug. 21, 2018

(65) Prior Publication Data

US 2020/0066924 A1 Feb. 27, 2020

(51) Int. Cl.
| | |
|---|---|
| *H01L 31/0216* | (2014.01) |
| *H02S 40/10* | (2014.01) |
| *H02S 40/30* | (2014.01) |
| *F24S 40/20* | (2018.01) |
| *B01J 31/18* | (2006.01) |
| *G06F 3/044* | (2006.01) |
| *B22F 9/24* | (2006.01) |
| *B01J 37/16* | (2006.01) |
| *B01J 35/00* | (2006.01) |

(52) U.S. Cl.
CPC .... *H01L 31/02167* (2013.01); *B01J 31/1805* (2013.01); *B01J 35/0013* (2013.01); *B01J 37/16* (2013.01); *B22F 9/24* (2013.01); *G06F 3/044* (2013.01); *H02S 40/10* (2014.12); *H02S 40/30* (2014.12); *F24S 40/20* (2018.05)

(58) Field of Classification Search
CPC ..... H01L 31/022425; H01L 31/022433; H01L 31/02167; H02S 40/10; B08B 6/00; B08B 17/02; F24S 40/20; G06F 2203/04112
See application file for complete search history.

(56) References Cited

U.S. PATENT DOCUMENTS

| | | | |
|---|---|---|---|
| 3,694,655 A | * | 9/1972 | Auer ..................... G01T 1/2935 250/389 |
| 4,575,696 A | * | 3/1986 | Hartmann .............. H03H 9/145 333/196 |
| 6,645,444 B2 | | 11/2003 | Goldstein |
| 6,911,593 B2 | | 6/2005 | Mazumder et al. |
| 8,773,392 B2 | | 7/2014 | Cok |

(Continued)

*Primary Examiner* — Andrew J Golden
(74) *Attorney, Agent, or Firm* — Kevin E. Spaulding; David A. Novais

(57) ABSTRACT

An electrode film includes a first electrode pattern having a first set of parallel conductive electrodes and a second electrode pattern having a second set of parallel conductive electrodes disposed on a surface of a transparent film. The conductive electrodes in the first and second electrode patterns are conductive mesh patterns including a pattern of open areas and are arranged in an interlaced pattern. The first and second electrode patterns are configured to be connected to respective sources of electrical power supplying respective waveforms to generate a time-varying electric field pattern above a surface of the electrode film.

17 Claims, 14 Drawing Sheets

(56) References Cited

U.S. PATENT DOCUMENTS

| | | | |
|---|---|---|---|
| 8,865,292 B2 | 10/2014 | Trauernicht et al. | |
| 9,433,336 B2 | 9/2016 | Mazumder | |
| 9,504,164 B2 | 11/2016 | Ramakrishnan et al. | |
| 2006/0057502 A1 | 3/2006 | Shimoda et al. | |
| 2009/0190219 A1* | 7/2009 | Teo | B03C 3/08 |
| | | | 359/507 |
| 2009/0218310 A1* | 9/2009 | Zu | H05K 1/032 |
| | | | 216/11 |
| 2010/0026664 A1* | 2/2010 | Geaghan | G06F 3/0446 |
| | | | 345/174 |
| 2011/0095990 A1* | 4/2011 | Philipp | G06F 3/0446 |
| | | | 345/206 |
| 2011/0283477 A1* | 11/2011 | Ashpis | H02S 40/10 |
| | | | 15/405 |
| 2012/0285516 A1* | 11/2012 | Mckarris | H02S 40/10 |
| | | | 134/1 |
| 2012/0291841 A1* | 11/2012 | Jang | H02S 40/10 |
| | | | 136/244 |
| 2013/0263393 A1 | 10/2013 | Mazumder | |
| 2014/0049485 A1 | 2/2014 | Oh et al. | |
| 2014/0158213 A1* | 6/2014 | Usui | H02S 40/10 |
| | | | 137/13 |
| 2014/0259468 A1* | 9/2014 | Maxik | B08B 6/00 |
| | | | 15/1.51 |
| 2016/0168713 A1 | 6/2016 | Reuter et al. | |
| 2016/0370916 A1* | 12/2016 | Hashimoto | G06F 3/0446 |
| 2017/0012147 A1 | 1/2017 | Cheong | |
| 2017/0214359 A1* | 7/2017 | McKarris | F24S 40/20 |

* cited by examiner

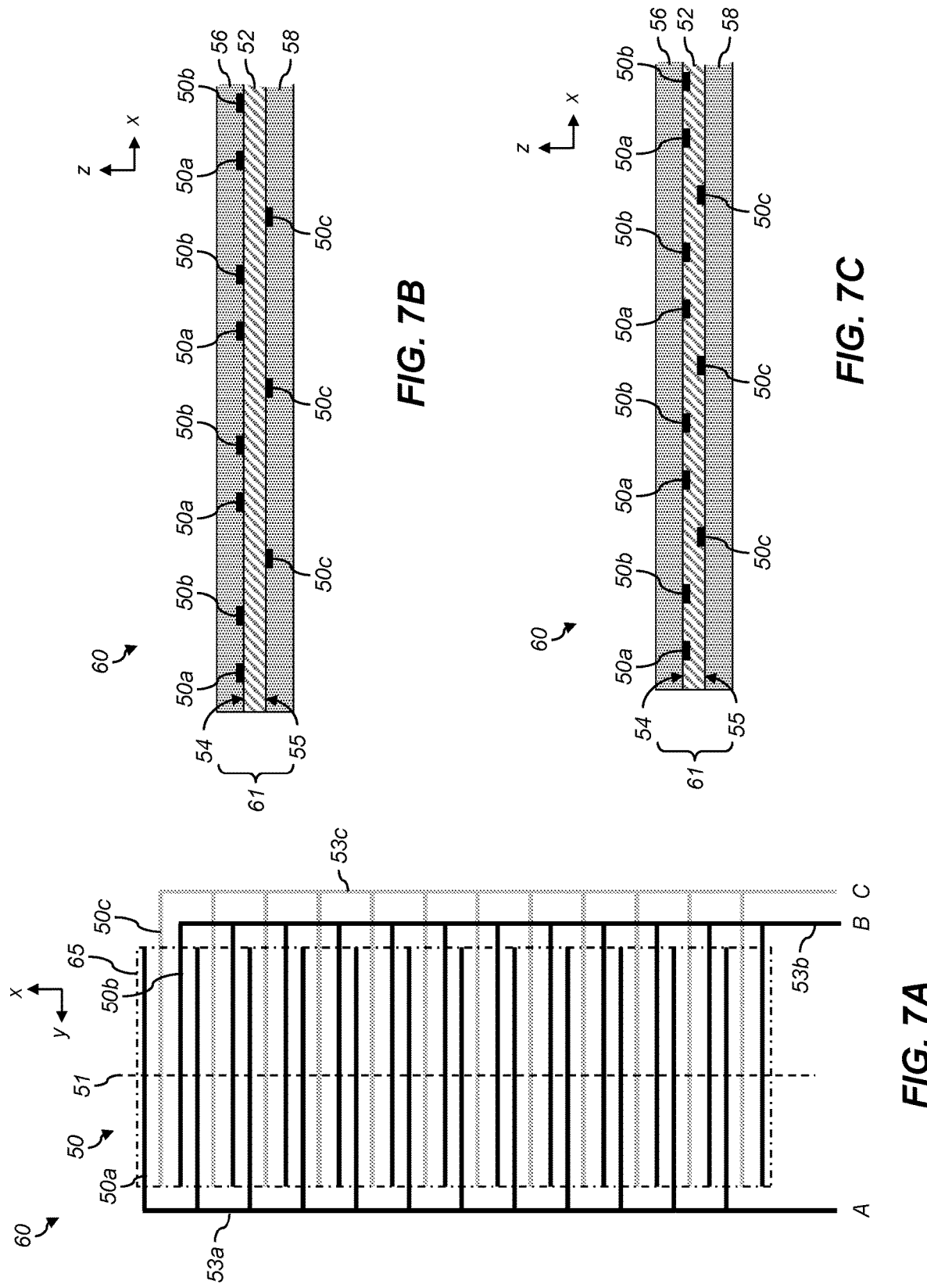

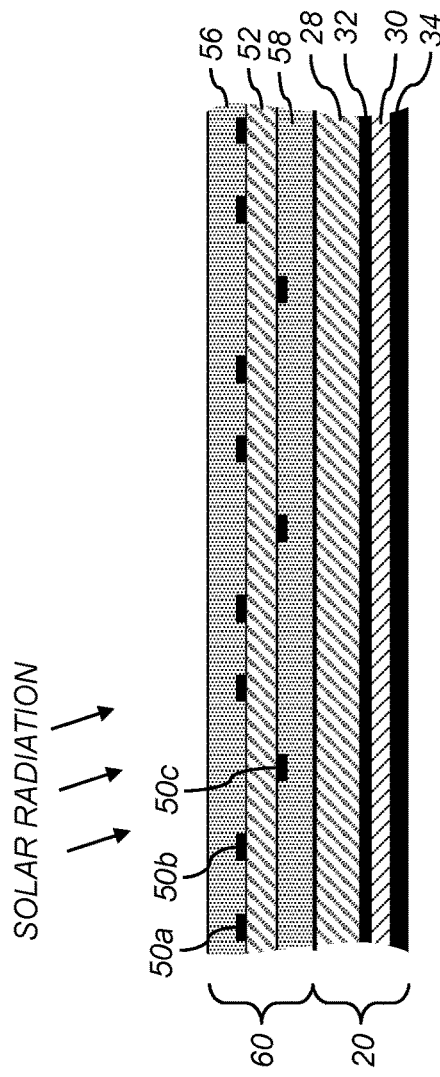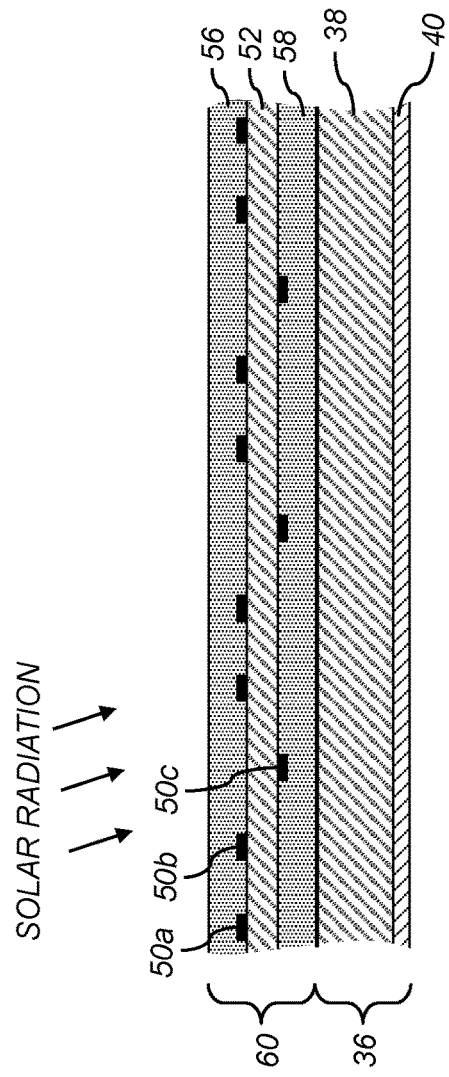

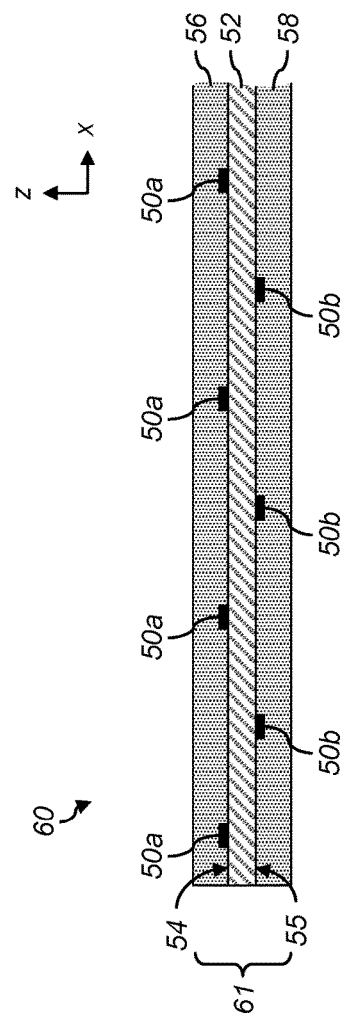
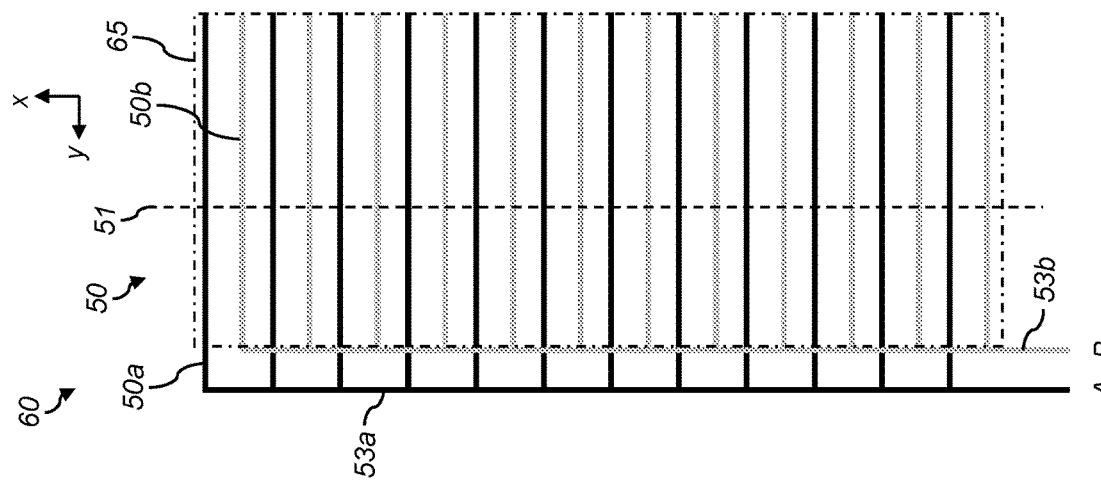

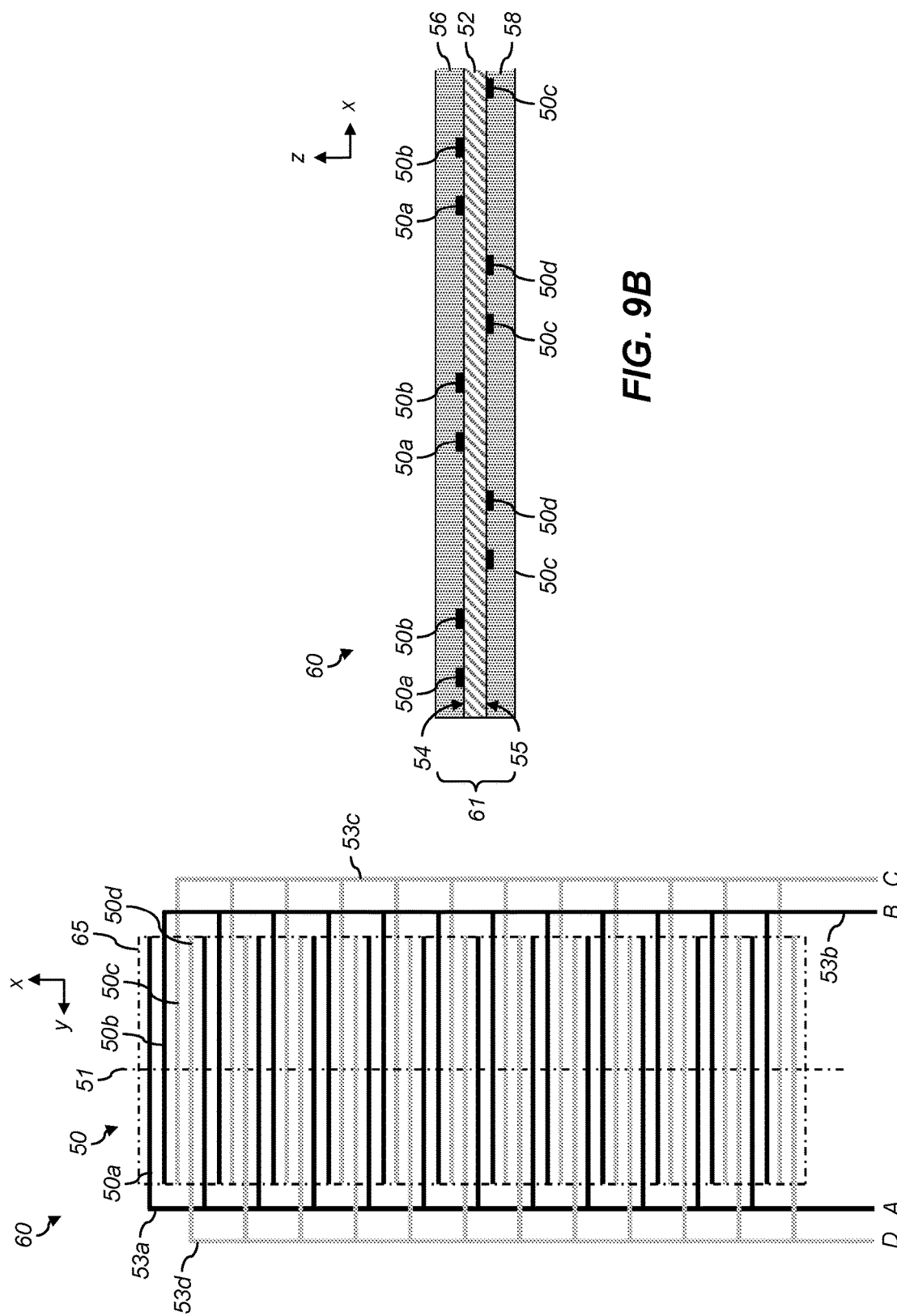

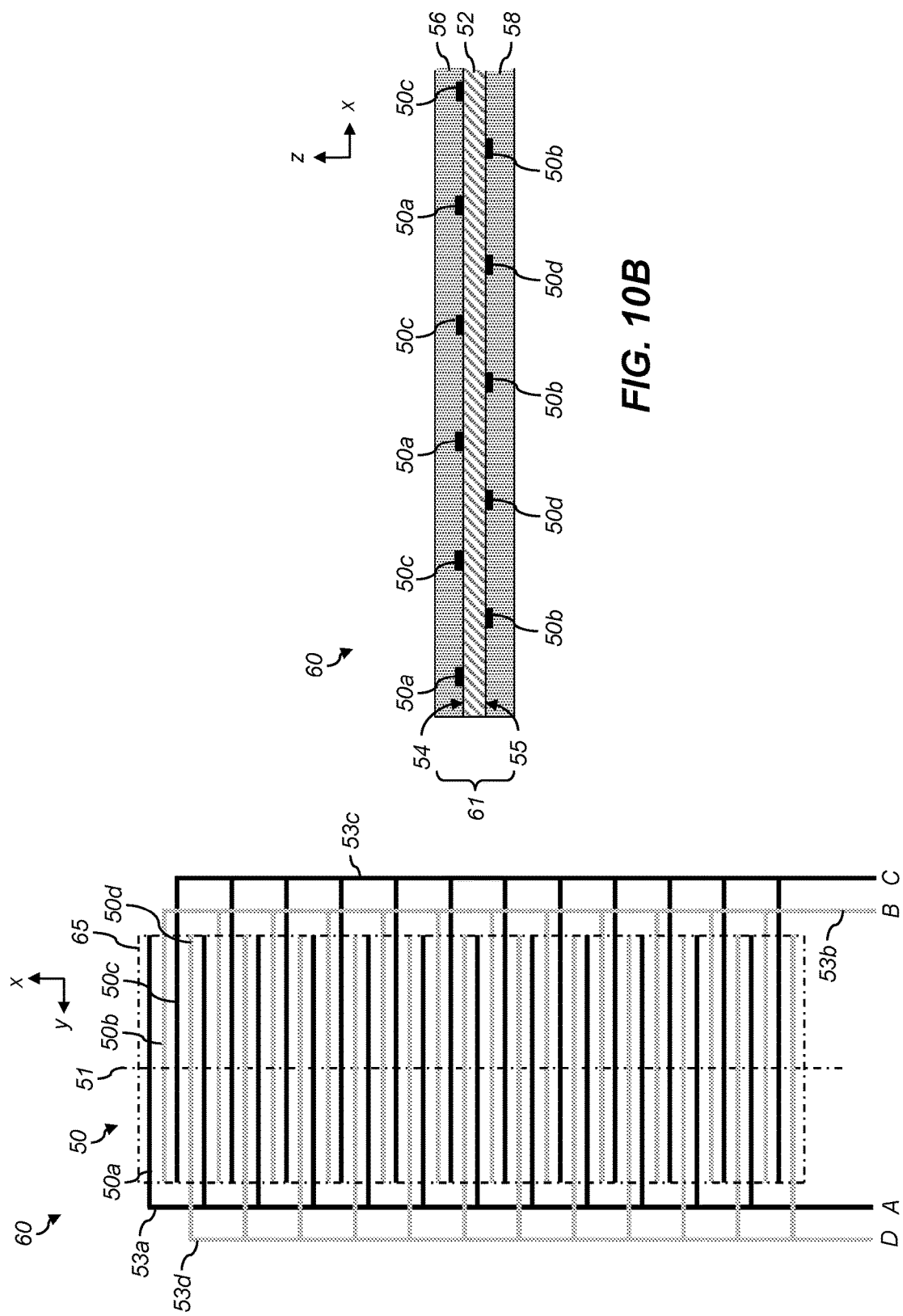

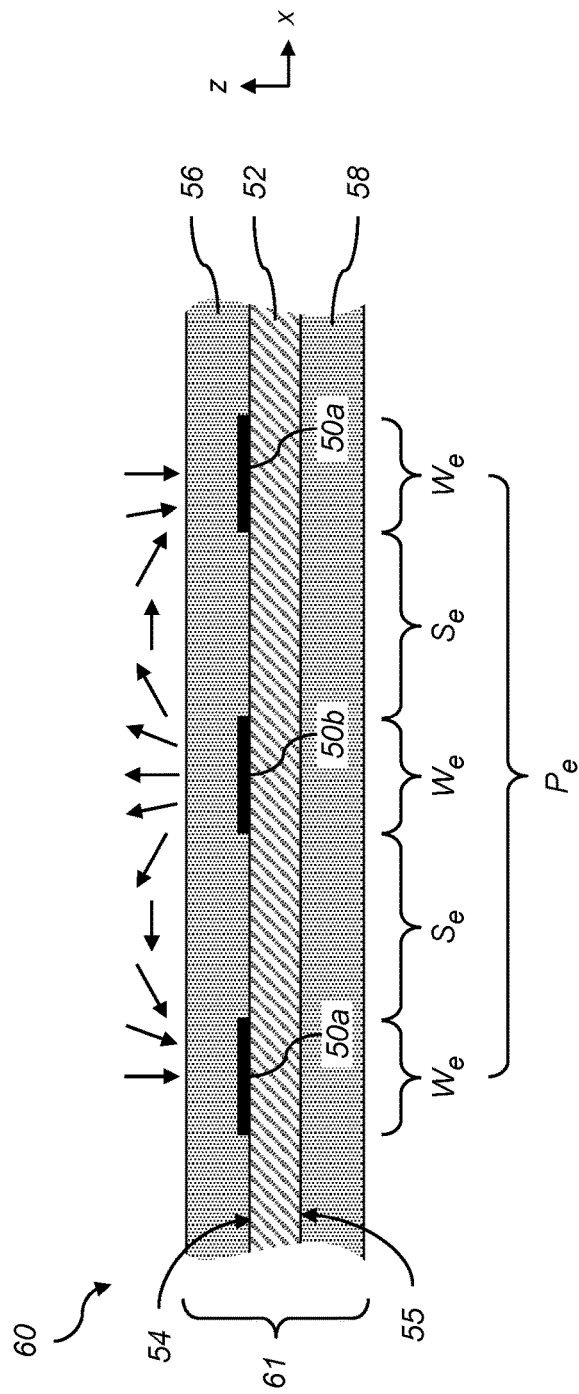
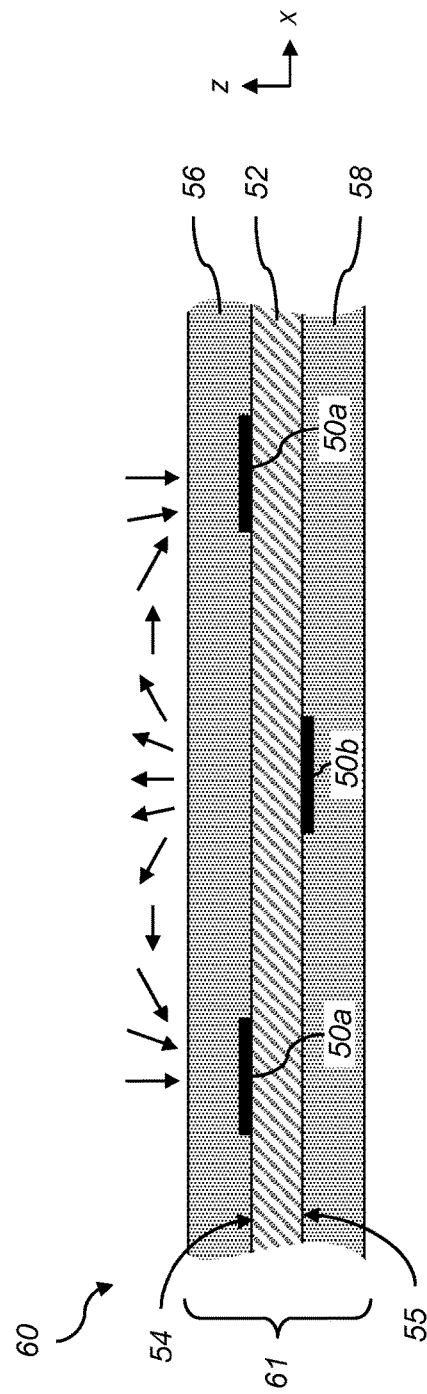
FIG. 11A
FIG. 11B

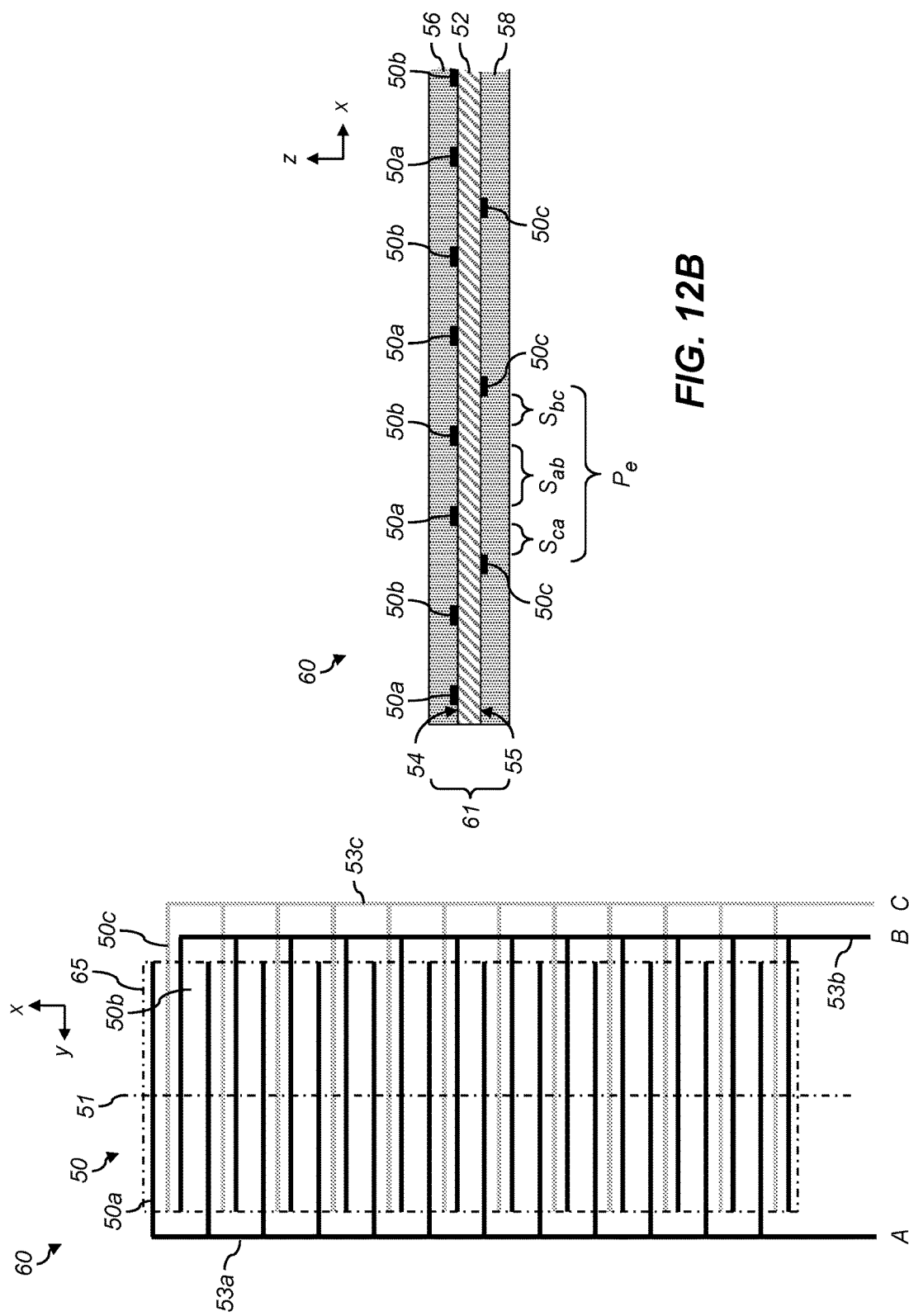

OPEN ELECTRODES FOR IN-PLANE FIELD GENERATION

STATEMENT REGARDING FEDERALLY-SPONSORED RESEARCH OR DEVELOPMENT

This invention was made with Government support under #DE-EE0007119 awarded by DOE. The Government has certain rights in this invention.

CROSS-REFERENCE TO RELATED APPLICATIONS

Reference is made to commonly assigned, U.S. patent application Ser. No. 16/106,051 (now U.S. Publication No. 2020/0061678), entitled: "Double-sided electrodynamic screen films," by D. Garman et al.; and to commonly assigned, U.S. patent application Ser. No. 16/106,062 (now U.S. Publication No. 2020/0066925), entitled: "Fabricating double-sided electrodynamic screen films," by D. Garman et al., each of which is incorporated herein by reference.

FIELD OF THE INVENTION

This invention pertains to the field of electrodynamic screen films, and more particularly to a novel electrode configuration.

BACKGROUND OF THE INVENTION

In-plane electric fields are used for the alignment of liquid crystals and other molecules, or for the movement of charged particles. In-plane switching of liquid crystals is used in displays, as well as in other optical applications. Some electrophoretic display architectures use in-plane electric fields to move colored particles for reflective displays. Another application of in-plane electric fields is for dust shields which are used for removal of dust or prevention of dust build-up on surfaces. Dust shields are particularly useful for cleaning windows, or surfaces in solar power systems such as photovoltaic (PV) surfaces (e.g., silicon solar panels), or mirrors for use in concentrated solar power (CSP).

U.S. Pat. No. 6,911,593 to Mazumder et al., entitled "Transparent self-cleaning dust shield," describes a transparent self-cleaning dust shield, also referred to as an electrodynamic shield (EDS), that has electrodes embedded within a thin transparent dielectric film or a sheet and is used to remove dust deposited on solar panels. The electrodes are in the same plane, and are therefore "co-planar."

Some of the major difficulties in applying EDS on solar panels include: (1) avoiding interactions between the electric field of the EDS electrodes and current collecting grids used in solar panels for providing electrical power; (2) scaling of the method of EDS construction for manufacturing and installing transparent electrodes on solar panels and solar concentrators; (3) obscuration of solar radiation caused by the placement of the EDS on the surface of solar panels and concentrators; (4) retrofitting existing solar photovoltaic and photothermal devices with self-cleaning EDS systems; (5) environmental degradation of polymer films under outdoors condition; (6) maintaining the efficiency of heat dissipation of solar panels integrated with EDS; and (7) cost-effective manufacturing of new solar panels and solar concentrators integrated with EDS for large-scale installations.

To address issue (2), new electrode geometries are needed which are robust, and avoid the need for multiple patterning steps. Current fabrication methods utilize patterned dielectric materials between electrode or bus cross-over points. This patterned dielectric adds manufacturing complexity due to additional process and pattern-alignment steps. Additionally, the patterned dielectric materials typically suffer from robustness issues, with defects or inherent materials properties leading to dielectric breakdown and electrode shorting.

Both displays and dust shields benefit from the use of transparent electrodes to generate the in-plane electric field. Transparent conductors are widely used in the flat-panel display industry to form electrodes that are used to electrically switch the light-emitting or light-transmitting properties of a display pixel, for example in liquid crystal displays. Transparent conductive electrodes are also used in touch-screens in conjunction with displays. In such applications, the transparency and conductivity of the transparent electrodes are important attributes. In general, it is desired that transparent conductors have a high transparency (for example, greater than 70%, and more preferably greater than 90%, in the visible spectrum) and a high conductivity (for example, less than 10 ohms/square).

Typical prior-art conductive electrode materials include indium tin oxide (ITO), and very thin layers of metal, for example silver or aluminum or metal alloys including silver or aluminum. These materials are coated, for example, by sputtering or vapor deposition, and patterned on display or touch-screen substrates, such as glass. However, the current-carrying capacity of such electrodes is limited, thereby limiting the length of electrode due to the resultant resistive losses. Moreover, the substrate materials are limited by the electrode material deposition process (e.g., sputtering). Thicker layers of metal oxides or metals can increase conductivity but reduce the transparency of the electrodes.

It is also known in the prior art to form conductive traces using nano-particles including, for example, silver. The synthesis of such metallic nano-crystals is known. For example, issued U.S. Pat. No. 6,645,444 to Goldstein, entitled "Metal nano-crystals and synthesis thereof," describes a process for forming metal nano-crystals optionally doped or alloyed with other metals. U.S. Patent Application Publication 2006/0057502 to Okada et al., entitled "Method of forming a conductive wiring pattern by laser irradiation and a conductive wiring pattern," describes fine wirings made by drying a coated metal dispersion colloid into a metal-suspension film on a substrate, pattern-wise irradiating the metal-suspension film with a laser beam to aggregate metal nano-particles into larger conductive grains, removing non-irradiated metal nano-particles, and forming metallic wiring patterns from the conductive grains. However, such wires are not transparent and thus the number and size of the wires limits the substrate transparency as the overall conductivity of the wires increases.

There is a conflict between the optical transparency and the conductivity (or surface resistance) of transparent electrodes. For example, copper films having a surface resistance of about 0.25 milliohms/square are commercially available, but their optical transparency is well below the desired level of 70%. Other commercially available thin-films formed from conductive materials such as ITO or silver have acceptable transparencies (for example, AgHT™ silver type films have optical transparencies greater than 75%), but such films have surface resistances in the range of 4-8 ohms/square, which is several orders of magnitude greater than that of the above copper films, or conventional conductors used for antenna construction.

There remains a need for robust electrode films for in-plane electric field generation that are capable of delivering the required high electric field strength over large areas, that are easy to connect with external power sources, are free from issues related to shorting, and are additionally easy to manufacture. There is a further need for these electrode films to be highly-transparent to minimize their impact on solar efficiency, in the case of EDS films for PV or CSP, or to minimize their visual-impact, in the case of displays or other direct-view in-plane field devices such as smart windows.

SUMMARY OF THE INVENTION

The present invention represents an electrode film, including: a transparent film of dielectric material;

a first electrode pattern disposed on a surface of the transparent film including a first set of parallel conductive electrodes connected to a first bus;

a second electrode pattern disposed on the surface of the transparent film including a second set of parallel conductive electrodes connected to a second bus;

wherein the first and second sets of parallel conductive electrodes are arranged in an interlaced pattern;

wherein the conductive electrodes in the first and second electrode patterns are conductive mesh patterns including a pattern of open areas; and wherein the first and second buses are configured to be connected to respective sources of electrical power supplying respective waveforms to generate a time-varying electric field pattern above a surface of the electrode film.

This invention has the advantage that forming the electrode patterns using conductive mesh patterns improves their transparency without substantially impacting the performance of the electrodynamic screen system.

BRIEF DESCRIPTION OF THE DRAWINGS

FIG. 7A is a schematic diagram showing the layout of electrodes for an exemplary double-sided electrodynamic screen having three sets of conductive elements;

FIGS. 7B-7C are cross-sectional diagrams for exemplary embodiments of the double-sided electrodynamic screen of FIG. 7A;

FIG. 7D is a schematic cross-sectional diagram showing the electrodynamic screen of FIG. 7B on a solar panel;

FIG. 7E is a schematic cross-sectional diagram showing the electrodynamic screen of FIG. 7B on a solar concentrator mirror;

FIG. 8A is a schematic diagram showing the layout of electrodes for an exemplary double-sided electrodynamic screen having two sets of conductive elements;

FIG. 8B is a cross-sectional diagram for an exemplary embodiment of the double-sided electrodynamic screen of FIG. 8A;

FIG. 9A is a schematic diagram showing the layout of electrodes for an exemplary double-sided electrodynamic screen having four sets of conductive elements;

FIG. 9B is a cross-sectional diagram for an exemplary embodiment of the double-sided electrodynamic screen of FIG. 9A;

FIG. 10A is a schematic diagram showing the layout of electrodes for another exemplary double-sided electrodynamic screen having four sets of conductive elements;

FIG. 10B is a cross-sectional diagram for an exemplary embodiment of the double-sided electrodynamic screen of FIG. 10A;

FIG. 11A illustrates an electric field pattern formed by energizing the electrodes in the single-sided electrodynamic screen of FIG. 5;

FIG. 11B illustrates an electric field pattern formed by energizing the electrodes in the double-sided electrodynamic screen of FIGS. 8A-8B;

FIGS. 12A-12B illustrate an exemplary double-sided electrodynamic screen similar to that of FIGS. 7A-7B where the electrode spacings are unequal;

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

Figure 1:
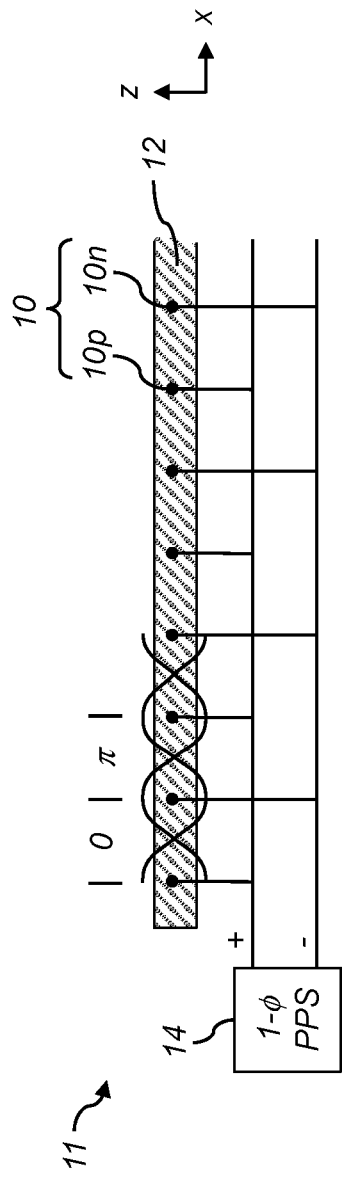
FIGS. 1 and 2 are schematic diagrams of arrangements using electrodynamic screens.

The present description will be directed in particular to elements forming part of, or cooperating more directly with, an apparatus in accordance with the present invention. It is to be understood that elements not specifically shown, labeled, or described can take various forms well known to those skilled in the art. It is to be understood that elements and components can be referred to in singular or plural form, as appropriate, without limiting the scope of the invention.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. It should be noted that, unless otherwise explicitly noted or required by context, the word "or" is used in this disclosure in a non-exclusive sense.

The example embodiments of the present invention are illustrated schematically and not to scale for the sake of clarity. One of ordinary skill in the art will be able to readily determine the specific size and interconnections of the elements of the example embodiments of the present invention.

Throughout the specification and claims, the following terms take the meanings explicitly associated herein, unless the context clearly dictates otherwise. The meaning of "a," "an," and "the" includes plural reference, the meaning of "in" includes "in" and "on." Additionally, directional terms such as "on," "over," "top," "bottom," "above," "below," "left," and "right" are used with reference to the orientation of the figure(s) being described. Because components of embodiments of the present invention can be positioned in a number of different orientations, the directional terminology is used for purposes of illustration only and is in no way limiting.

There are several applications of self-cleaning electrodynamic screens (EDS) including:

1. Solar photovoltaic (PV) systems (rigid PV panels and thin film PV panels);
2. Solar concentrators (mirrors, Fresnel lenses, parabolic troughs, glass envelopes of the central receivers, and other devices used for PT and PV systems);
3. Dust removal from glass plates with textured surface used for light trapping and surface plasmonic devices;
4. Particle collection in electrostatic beneficiation and electrostatic precipitation of powders;
5. Optical windows, surveillance camera lenses, vehicle windshields, building windows, and the like;
6. Other devices or systems having a transparent component such as a window, lens, panel or screen, including visual display screens of a computer or other data processing and/or display system, operated in an environment that promotes unwanted deposition of particles such as dust or powder;
7. In-situ monitoring of pharmaceutical powder processing using UV-VIS-IR radiation; and
8. Containment, manipulation or control of particulate material such as dust and powder, wherein the EDS may be applied to either a transparent or an opaque substrate.

One major application of EDS integration with solar photovoltaic (PV) panels and concentrated solar power (CSP) systems is to solve the challenge of maintaining full power output of the solar installations in dusty regions without requiring water and manual cleaning. Minimizing loss of power due to dust deposition can provide many-fold savings compared to the cost of initial installation of the EDS technology. Additionally, load mismatch problems caused by dust deposition can also be mitigated.

U.S. Pat. No. 9,433,336 to Mazumder, entitled "Self-cleaning solar panels and concentrators with transparent electrodynamic screens," which is incorporated herein by reference, describes a number of configurations for electrodynamic screens (EDS). FIGS. 1-6, which are adapted from U.S. Pat. No. 9,433,336, describe several exemplary embodiments of EDS systems.

Figure 2:
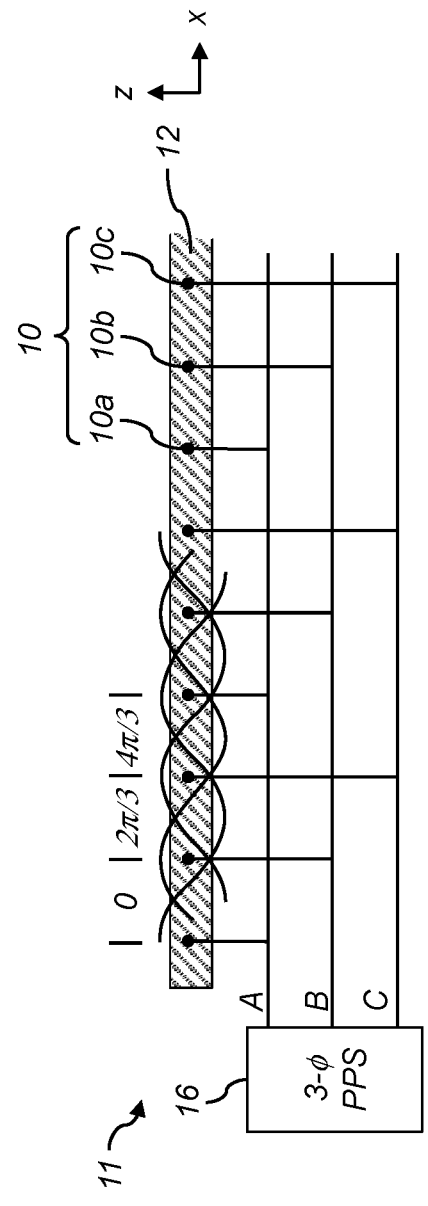

FIGS. 1 and 2 illustrate exemplary arrangements of prior art electrodynamic screen (EDS) systems. A film assembly 11 (shown in cross section) includes a pattern of conductive electrodes 10 embedded within a dielectric film 12. The electrodes 10 can be energized either by using a single-phase or by a polyphase AC drive signal. FIG. 1 shows the electrodes 10 activated using a single-phase pulsed power source (1-Φ PPS) 14. The single-phase outputs are labeled "+" and "−", and the field components are shown as "0" and "π". The "+" output is used to supply power to conductive electrodes 10p, and the "−" output is used to supply power to conductive electrodes 10n. FIG. 2 shows the electrical connections for the electrodes 10 for a three-phase pulsed power source (3-Φ PPS) 16. The three-phase outputs are labeled "A", "B", and "C", and the corresponding field components as "0", "2π/3" (i.e., 120°), and "4π/3" (i.e., 240°). The "A" output is used to supply power to conductive electrodes 10a, the "B" output is used to supply power to conductive electrodes 10b, and the "C" output is used to supply power to conductive electrodes 10c.

The single-phase excitation of FIG. 1 produces a standing wave between the electrodes 10, and the polyphase drive of FIG. 2 produces a traveling wave. The distribution of the electric field E is non-uniform with respect to the spatial coordinates x and z (left-right and vertical, respectively, in FIGS. 1 and 2), and the field strength E varies with time t.

The standing wave produced by single-phase excitation works for removing particles in the following manner. A standing wave can be considered as the superposition of two traveling waves moving in opposite directions. Thus, any instability in the AC electric field, the presence of harmonics in the applied field, or any air currents on the top surface of the panel produce a drift velocity to transport the dust particles levitated by the electrodynamic forces from the surface to move away from the screen. Since PV panels are always tilted with respect to the horizontal plane, gravitational force also helps in sliding off the levitated dust particles to ground.

Figure 3:
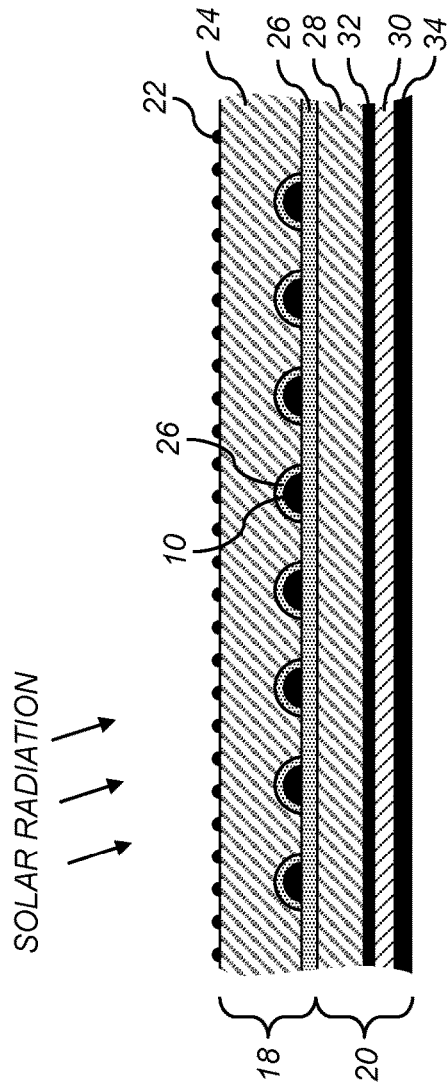
FIG. 3 is a schematic cross-sectional diagram of an electrodynamic screen on a solar panel.

FIG. 3 is a schematic depiction of an exemplary prior art electrodynamic screen (EDS) 18 integrated on a PV solar panel 20. The EDS 18 includes parallel transparent electrodes 10 for applying an electrical field; a thin layer of a transparent film 24 (e.g., of a fluoropolymer); a thin protective layer 26 (e.g., of $SiO_2$) used for protecting the electrodes 10 against voltage breakdown; and an optional array of nano-sized planoconvex lenses 22, which function as an anti-reflecting and light trapping surface structure on the top surface of the EDS 18. The solar panel 20 includes a cover glass plate 28 (e.g., of borosilicate); a semiconducting film 30 for light absorption; a layer of current collecting grids 32; and a current collecting metal back plate 34.

Figure 4:
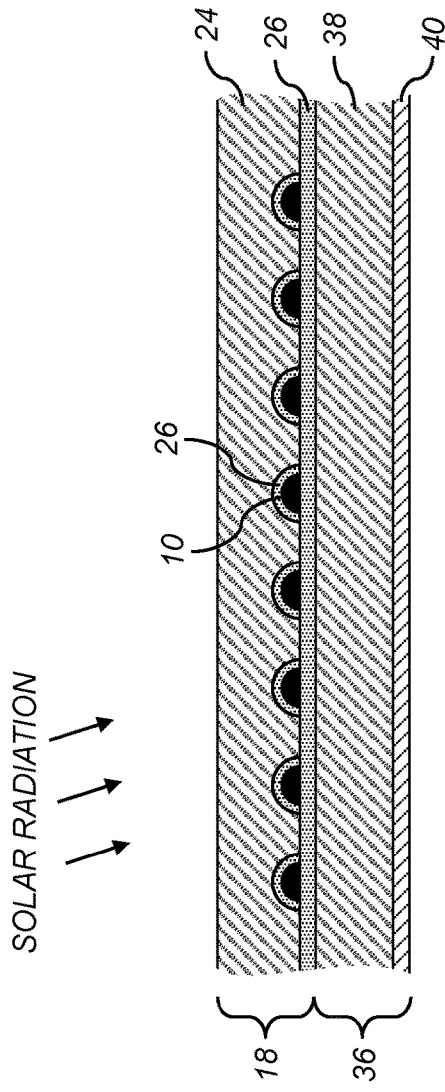
FIG. 4 is a schematic cross-sectional diagram of an electrodynamic screen on a solar concentrator mirror.

FIG. 4 is a schematic diagram of the prior art electrodynamic screen (EDS) 18 integrated with a solar concentrator mirror 36. This structure is similar to that of FIG. 3, with the concentrator mirror 36 being a back-surface mirror including a cover glass plate 38 (e.g., of a borosilicate or low-iron glass) and a silver coating 40. It is also known that a polymer may be substituted for the cover glass plate 38 for flexibility.

Solar power components, such as those shown in FIGS. 3 and 4 are deployed along with external components or systems for energy use or storage. In the case of a PV solar panel 20, it may be used in conjunction with a battery or a more extensive electrical distribution grid that delivers electricity from the solar panel 20 to electrical loads. Note that the solar panel 20 is sometimes referred to as a solar module or a PV module. Typically, a plurality of solar panels 20 are arranged in an array for deployment in the field. A solar concentrator mirror 36 can direct concentrated solar heating to a pipe or similar vessel for heating a working fluid, whose heat content may be used directly or indirectly such as through a turbine or similar converter.

In one exemplary prior art EDS configuration, a set of parallel transparent Indium Tin Oxide (ITO) electrodes 10 of rectangular cross section (e.g., having a width 100 μm, and height 20 μm) were deposited with an inter-electrode spacing of 1000 μm. The electrodes 10 were embedded within a polyurethane (PU) transparent film 24 with a film thickness of 50 μm. The thickness of these ITO electrodes can be varied (e.g., from 10 to 100 μm), and the inter-electrode spacing can also be varied (e.g., from 100 to 1000 μm) to achieve EDS operation. In configurations using ITO or other transparent conductive oxide (TCO), there is a challenge in fabrication. Patterns of ITO are typically created using subtractive manufacturing techniques, where a uniform layer of material is deposited and then the pattern is created by a combination of photolithography and etching. The deposition techniques used for TCOs, such as sputtering or CVD, are typically done in a vacuum environment and are costly. Likewise, subtractive patterning is a multi-step process that is both labor-intensive and a high waste process. Alternative means for fabricating useful transparent electrodes for EDS and other in-plane electric field generating films are needed.

Figure 6:
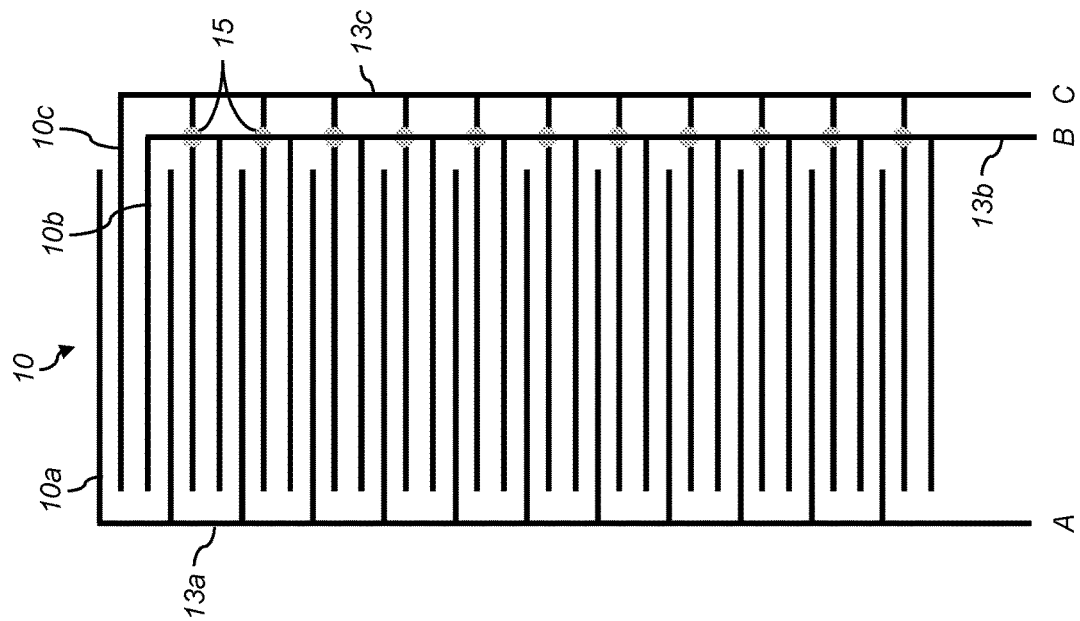
FIGS. 5 and 6 are schematic diagrams showing the layout of electrodes for prior art electrodynamic screens.
Figure 5:
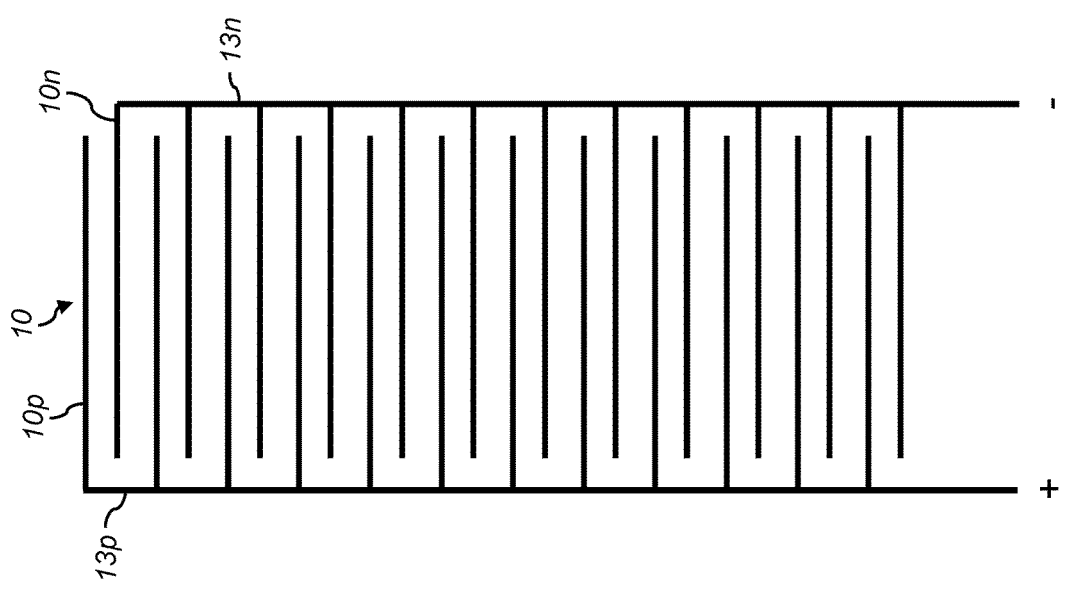

FIGS. 5 and 6 show schematic layouts for patterns of conductive electrodes 10 for prior art single-phase EDS systems (FIG. 5) and three-phase EDS systems (FIG. 6), respectively. The patterns of conductive electrodes 10 for the single-phase EDS system of FIG. 5 include a first set of parallel conductive electrodes 10$p$ connected to the "+" output of the single-phase pulsed power source 14 (FIG. 1) by a bus bar 13$p$, and a second set of parallel conductive electrodes 10$n$ connected to the "−" output of the single-phase pulsed power source 14 by a bus bar 13$n$. The first and second sets of conductive electrodes 10$p$, 10$n$ are interdigitated and arranged in an interlaced pattern. The interlaced pattern can also be referred to as an alternating pattern, or a repeating positive-negative sequence.

Similarly, the patterns of conductive electrodes 10 for the three-phase EDS system of FIG. 6 include a first set of parallel conductive electrodes 10$a$ connected to the "A" output of the three-phase pulsed power source 16 (FIG. 1) by a bus bar 13$a$, a second set of parallel conductive electrodes 10$b$ connected to the "B" output of the three-phase pulsed power source 16 by a bus bar 13$b$, and a third set of parallel conductive electrodes 10$c$ connected to the "C" output of the three-phase pulsed power source 16 by a bus bar 13$c$. The first, second and third sets of conductive electrodes 10$a$, 10$b$, 10$c$ are interdigitated and arranged in an interlaced pattern. The interlaced pattern can also be referred to as an alternating pattern, or a repeating A-B-C sequence.

In the arrangement of FIG. 6, the bus bar 13$b$ for the second set of conductive electrodes 10$b$ cross over the third set of conductive electrodes 10$c$. To prevent shorts, it is necessary to provide an insulating material between the bus bar 13$b$ and the conductive electrodes 10$c$. In the illustrated prior art configuration, the insulating material is provided by insulating pads 15 disposed between the bus bar 13$b$ and the conductive electrodes 10$c$. The insulating pads 15 can be an insulating film or patterned material coating applied over the conductive electrodes 10$c$ before forming the bus bar 13$b$. While fabrication techniques for forming such structures are known in the art, the need for providing the insulating material at the cross-over points can significantly increase the cost and complexity of the fabrication process. Furthermore, the processes used to form insulating pads 15 or other dielectric barriers between the bus bar 13$b$ and conductive electrodes 10$c$ are prone to defects. The insulating pads must withstand the voltage differential (i.e., the out-of-plane electric field) between the bus bar 13$b$ and the conductive electrodes 10$c$ when the voltage is supplied. The electric fields, and therefore the voltages, used in EDS and other in-plane particle moving applications are high. The dielectric material of the insulating pads must not itself breakdown at full thickness or at a defect, which would allow the electrodes to short.

The present invention represents an improvement over the prior art EDS configurations that eliminates the need for cross-overs between the different sets of electrodes. This has the advantage that it substantially simplifies the fabrication of the EDS systems since it doesn't require the use of insulating pads, and reduces the associated cost. Furthermore, the resulting EDS systems have improved reliability because it eliminates the possibility of shorts forming due to breakdown of the insulating materials used at the cross-over points.

FIGS. 7A-7B illustrate an electrodynamic screen (EDS) 60 in accordance with an exemplary embodiment. FIG. 7B shows a cross-section through an electrode film 61 of the EDS 60 taken at cut-line 51 in FIG. 7A. The EDS 60 includes three sets of parallel conductive electrodes 50. A first set of conductive electrodes 50$a$ and a second set of conductive electrodes 50$b$ are disposed on a first side 54 of a transparent film 52 of a dielectric substrate material. A third set of conductive electrodes 50$c$ (shown with gray lines) is disposed on a second side 55 of the transparent film 52. In the embodiment illustrated in FIG. 7B the conductive electrodes 50 are disposed over the surfaces of the transparent film 52. In other embodiments, the conductive electrodes 50 can be embedded into the surfaces of the transparent film 52 as illustrated in FIG. 7C. For example, such electrodes can be formed using an "imprint and fill" technique such as that disclosed in commonly-assigned U.S. Pat. No. 8,865,292 to Trauernicht et al., entitled "Micro-channel structure for micro-wires," which is incorporated herein by reference Within the context of the present invention the terms "on the surface" or "disposed on the surface" includes both electrodes that are over the surface (as in FIG. 7B) or electrodes that are embedded partially or fully into the surface (as in FIG. 7C).

The electrode film 61, when used in an EDS system, preferably includes layers 56, 58 of a dielectric material to protect the conductive electrodes 50$a$, 50$b$, 50$c$ from physical damage, and also prevents shorting between the conductive electrodes 50$a$, 50$b$, 50$c$ and other system components or the external environment. In some embodiments, the layers 56, 58 can include a transparent adhesive that serve to attach the electrode film 61 to a separate protective cover sheet, or to the surface of the item to be cleaned (such as a solar panel or CSP mirror).

Bus bars 53$a$, 53$b$, 53$c$ are connected to the first, second and third sets of conductive electrodes 50$a$, 50$b$, 50$c$, respectively, and are adapted to be powered by respective sources of electrical power supplying respective waveforms. Exemplary types of waveforms that could be used in accordance with the present invention include sinusoidal waves, square waves, trapezoidal waves, triangular waves and sawtooth waves. In an exemplary configuration the same type of waveform is supplied to each of the sets of conductive electrodes 50$a$, 50$b$, 50$c$, although this is not required. In an exemplary embodiment, the sources of electrical power correspond to the outputs of a three-phase pulsed power source 16 (FIG. 2) described earlier with respect to the prior art three-phase EDS system illustrated in FIGS. 2 and 6. The electrical waveforms supplied to the conductive electrodes 50$a$, 50$b$, 50$c$ generate a time-varying, in-plane electric field pattern above a surface of the EDS 60 in an active area 65. (The active area 65 is the region of the EDS 60 that includes the interlaced conductive electrodes 50$a$, 50$b$, 50$c$. The active area 65 does not include the bus bars 53$a$, 53$b$, 53$c$.) Within the context of the present invention an in-plane electric field is defined to be an electric field between two electrodes having a portion of the field-vector that is parallel to the substrate surface.

The first, second and third sets of conductive electrodes 50$a$, 50$b$, 50$c$ are interdigitated and are arranged in an interlaced pattern such that they form a repeating sequence in the x-direction. Elements of the first electrode pattern (including the first set of conductive electrodes 50a and the associated bus bar 53a) do not cross over elements of the second electrode pattern (including the second set of conductive electrodes 50b and the associated bus bar 53b). Furthermore, the elements of the third electrode pattern (including the third set of conductive electrodes 50c and the associated bus bar 53c) are separated from the elements of the first and second electrode patterns by the transparent film 52. As a result, there is no need to separate elements of any of the electrode patterns using layers insulating material (such as the insulating pads 15 of FIG. 6).

The substrate materials used for the transparent film 52 in accordance with the present invention can be any dielectric material that acts as a mechanical support for the subsequently applied layers. The substrate can include a rigid material such as glass. In preferred embodiments, the substrate is a flexible dielectric material such as a polymer film or paper such as Teslin. Useful substrate materials include organic or inorganic materials. For example, the substrate can include inorganic glasses, ceramic foils, polymeric materials, filled polymeric materials, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). The thickness of transparent film 52 can vary, typically from about 10 µm to about 1 cm. In embodiments of the present invention having conductive electrodes 50a, 50b, 50c on opposing sides of the transparent film 52, the thickness of the transparent film 52 is preferable between 10 µm and 200 µm. In embodiments of the present invention where the conductive electrodes 50a, 50b, 50c of an electrode film 61 have an open geometry for transparency, thicker substrates may be used since the substrate can also perform the function of the external protective layers.

In an exemplary embodiment, a flexible substrate is used for the transparent film 52 is used in accordance with the present invention. Using a flexible substrate allows for roll processing, which can be continuous, providing economy of scale and economy of manufacturing over flat or rigid supports. The flexible substrate chosen is preferably capable of wrapping around the circumference of a cylinder of less than about 50 cm in diameter, more preferably 25 cm in diameter, and most preferably 10 cm in diameter, without distorting or breaking, using low force as by unaided hands. The preferred flexible substrate can be rolled upon itself. Nominally rigid materials that are flexible due to their thinness may also be used. These include glass (e.g., Corning® Willow® Glass) at thicknesses below 200 µm.

In some exemplary embodiments, the transparent film 52 can include a temporary support or support material layer, for example, when additional structural support is desired for a temporary purpose (e.g., manufacturing, transport, testing, or storage). In such embodiments, the transparent film 52 can be detachably adhered or mechanically affixed to the temporary support. For example, a flexible polymeric substrate can be temporarily adhered to a rigid glass support to provide added structural rigidity during the manufacturing process. The glass support can be removed from the flexible polymeric substrate after completion of the manufacturing process.

The transparent film 52 can be a bare substrate material indicating that it contains no substantial materials on its surface other the material from which it is composed. Alternatively, the transparent film 52 can include various layers on the surface. These layers include subbing layers, adhesion layers, release layers, wetting layers, hydrophilic layers, and hydrophobic layers. The surface of the transparent film 52 can be treated in order to promote various properties. These treatments include plasma treatments, corona discharge treatments, and chemical treatments.

The transparent film 52 can also include patterned materials on its surface. These patterns may include patterns that modulate light transmission or electrical conductivity within or on the substrate. In preferred embodiments of electrode films 61, these patterns that modulate light transmission can be utilized to maximize the overall performance of a solar energy harvesting system. The patterns may include complete devices, circuits, or active elements existing on the substrate. The patterns may include portions of devices, circuits, or active elements awaiting subsequent processing steps for completion. These elements can be within the area of the transparent film 52 having the conductive electrodes 50a, 50b, 50c, or can be within regions of the transparent film 52 that do not overlap with the conductive electrodes 50a, 50b, 50c.

In an exemplary embodiment, the EDS 60 is positioned over the surface of a component in a solar power system and is used to prevent the buildup of particles on the surface. For example, FIG. 7D shows a configuration analogous to that shown in FIG. 3 where the EDS 60 is positioned over the surface of a photovoltaic solar panel 20. Similarly, FIG. 7E shows a configuration analogous to that shown in FIG. 4 where the EDS 60 is positioned over the surface of a solar concentrator mirror 36. In other embodiments, the EDS 60 can be positioned over other types of surfaces such as windows (e.g., office or residential building windows) or street lighting. When used for windows, the metal mesh can also serve the dual function of reducing IR and visible light transmission (e.g., low-e windows and tinted windows). In embodiments where the electrodes are used in other non-EDS applications, application appropriate integration should be expected.

While the exemplary embodiment described in FIGS. 7A-7B uses three sets of conductive electrodes 50a, 50b, 50c, it will be obvious that the inventive principles can also be applied to other configurations. For example, FIGS. 8A-8B illustrate an exemplary embodiment which includes only two sets of conductive electrodes 50a, 50b. In this case, the first set of conductive electrodes 50a is disposed on the first side 54 of a transparent film 52, and the second set of conductive electrodes 50b (shown with gray lines) is disposed on the second side 55 of the transparent film 52. This configuration is analogous to the example discussed earlier relative to FIGS. 1 and 5. Even though it is possible to fabricate the configuration of FIG. 5 without the need for any cross-overs, there can still be benefits to the embodiment of FIGS. 8A-8B where the sets of conductive electrodes 50a, 50b are positioned on opposite sides of the transparent film 52. For example, it can enable the bus bars 53a, 53b to be positioned in closer proximity to enable more convenient connections to the sources of electrical power. This can be particularly useful in configurations where multiple EDS panels are positioned adjacent to each other in a tiled arrangement.

The electrode patterns can have a wide variety of geometries. While the figures are not necessarily to scale, in the configurations illustrated thus far, the conductive electrodes have been shown as being shorter than the corresponding bus bars for clarity, and appear to be in a "portrait" mode. However, in some embodiments, the conductive electrodes will be significantly longer than the bus bars. This increases the advantage of having the bus bars exit the electrode film near to each other (in x-y) without needing to extend one or more of the bus bars around the perimeter of the active area. As the overall length of the bus bars goes up, the resistive losses increase. This can be partially compensated for by increasing the voltage at the connection to the bus bars. However, the increase in resistive loss comes with an increase in current, and at the high voltages required for many applications the increase in current can make for dangerous and near-lethal conditions in operation. Additionally, for applications where more complicated patterns of parallel electrodes are required to generate in-plane electric fields there may be multiple bus bars going to multiple "pixel" electrodes. In these applications, the placement of the bus-bars may be restricted due to area constraints or undesirable field formation between the bus bars. When the bus bars are placed on both sides of the substrate, the dielectric substrate can mitigate unwanted field formation between the bus bars.

FIGS. 9A-9B illustrate another exemplary embodiment which utilizes four sets of conductive electrodes 50a, 50b, 50c, 50d. In this case, the first set of conductive electrodes 50a and the second set of conductive electrodes 50b are disposed on the first side 54 of a transparent film 52, and the third set of conductive electrodes 50c and the fourth set of conductive electrodes 50d (shown with gray lines) are disposed on the second side 55 of the transparent film 52.

The first, second, third and fourth sets of conductive electrodes 50a, 50b, 50c, 50d are interdigitated and are arranged in an interlaced pattern such that they form a repeating sequence in the x-direction. Elements of the first electrode pattern (including the first set of conductive electrodes 50a and the associated bus bar 53a) do not cross over elements of the second electrode pattern (including the second set of conductive electrodes 50b and the associated bus bar 53b). Likewise, elements of the third electrode pattern (including the third set of conductive electrodes 50c and the associated bus bar 53c) do not cross over elements of the fourth electrode pattern (including the fourth set of conductive electrodes 50d and the associated bus bar 53d). As a result, there is no need to separate elements of any of the electrode patterns using layers insulating material (such as the insulating pads 15 of FIG. 6).

In this case, the bus bars 53a, 53b, 53c, 53d associated with the sets of conductive electrodes 50a, 50b, 50c, 50d are adapted to be powered by respective sources of electrical power supplying respective waveforms (e.g., the outputs of a four-phase pulsed power source). The electrical waveforms supplied to the conductive electrodes 50a, 50b, 50c, 50d generate a time-varying, in-plane electric field pattern above a surface of the EDS 60.

FIGS. 10A-10B illustrates another exemplary embodiment similar to that of FIGS. 9A-9B which utilizes four sets of conductive electrodes 50a, 50b, 50c, 50d. In this case, the first set of conductive electrodes 50a and the third set of conductive electrodes 50c are disposed on the first side 54 of a transparent film 52, and the second set of conductive electrodes 50b and the fourth set of conductive electrodes 50d (shown with gray lines) are disposed on the second side 55 of the transparent film 52.

The first, second, third and fourth sets of conductive electrodes 50a, 50b, 50c, 50d are interdigitated and are arranged in an interlaced pattern such that they form a repeating sequence in the x-direction. Elements of the first electrode pattern (including the first set of conductive electrodes 50a and the associated bus bar 53a) do not cross over elements of the third electrode pattern (including the third set of conductive electrodes 50c and the associated bus bar 53c). Likewise, elements of the second electrode pattern (including the second set of conductive electrodes 50b and the associated bus bar 53b) do not cross over elements of the fourth electrode pattern (including the fourth set of conductive electrodes 50d and the associated bus bar 53d). As a result, there is no need to separate elements of any of the electrode patterns using layers insulating material (such as the insulating pads 15 of FIG. 6).

FIG. 11A illustrates the electric field patterns formed above a surface of the electrode film 61 by energizing the conductive electrodes 50a, 50b in a single-sided EDS 60 having two sets of conductive electrodes 50a, 50b, similar to that shown in FIG. 5. The conductive electrodes 50a, 50b have a width $W_e$ and are separated by a spacing $S_e$. The electrode pitch between the centers of electrodes in the same set of conductive electrodes 50a is given by $P_e$.

At the illustrated point in time, the electrical waveform supplied to the second set of conductive electrodes 50b in the EDS 60 of FIG. 11A has a higher potential than the electrical waveform supplied to the first set of conductive electrodes 50a so that the field lines general point outward from the conductive electrodes 50b. Above the center of the conductive electrodes 50a, 50b, the electric field is primarily normal to the surface of the electrode film 61. In the region between the conductive electrodes 50a, 50b, the electric field is primarily in-plane (i.e., parallel to the surface of the electrode film 61). The magnitude of the electric field decreases as the distance from the conductive electrodes 50a, 50b increases (both vertically and laterally). For applications using in-plane fields to move particles, or switch molecular orientation (LCDs, for example) the field magnitude as a function of distance from the electrodes is an important design consideration. As noted earlier, EDS systems typically have at least one layer 56 of dielectric material between the conductive electrodes 50a, 50b and the front-side surface of the system to provide protection for the conductive electrodes 50a, 50b. In order to maximize the electric field for a given applied voltage, the thickness of the layer(s) 56 should be minimized.

For double-sided EDS systems, such as that illustrated in FIG. 8B, there will be an additional layer (i.e., the transparent film 52) between the lower conductive electrodes 50b and the surface of the electrode film 61. As a result, the electric field strengs over the surface will be somewhat lower in such configurations as illustrated in FIG. 11B. It can be seen that the magnitude of upward electric field over the lower conductive electrodes 50b is somewhat lower relative to the comparable single-sided EDS 60 shown in FIG. 11A. The magnitude of the in-plane electric fields between the conductive electrodes 50a, 50b will also be somewhat lower. For most systems, the thickness of the transparent film 52 is substantially thinner than that of the layer(s) 56 above the conductive electrodes 50a, 50b, so that the decrease in the electric field strength is relatively small. As a result, a relatively wide range of transparent film thicknesses can be used without modification to the basic EDS design.

The impact of the transparent film 52 on the electric fields in a double-sided EDS system can be characterized by evaluating the electrode field above the center of each conductive electrode 50a, 50b, at the plane of interest. The larger the electric field normal to each conductive electrode 50a, 50b in an electrode pair, the greater the in-plane electric field will be in the region between the conductive electrodes 50a, 50b. The ratio of the electric field magnitudes over the conductive electrodes 50a, 50b can be used to characterize the impact of the thickness of the transparent film 52. Table 1 illustrates computed electric field ratios $R=|E_L|/|E_U|$ for typical EDS materials and dimensions, where $|E_L|$ is the magnitude of the electric field over the lower conductive electrodes 50b and $|E_U|$ is the magnitude of the electric field over the upper conductive electrodes 50a.

TABLE 1

Ratio of electric fields as a function of transparent film thickness.

| Thickness of Transparent Film (μm) | Electric Field Ratio, R |
|---|---|
| 0 | 1.00 |
| 50 | 0.87 |
| 75 | 0.82 |
| 100 | 0.78 |

It can be seen that for thicknesses as large as 100 μm, the electric field ratio only drops to R=0.78. In preferred embodiments, the thickness and dielectric properties of the transparent film 52 are selected so that the R≥0.75.

In cases where the effect of the thickness of the transparent film 52 on the electric field magnitude cannot be ignored, there are several ways to mitigate it's impact. One approach is to increase the amplitude of the voltage waveform supplied to the lower electrodes (e.g., conductive electrodes 50b in FIG. 11B) to compensate for the substrate thickness. For cases where there are three or more sets of conductive electrodes 50a, 50b, 50c (e.g., see FIGS. 7A-7B), the electrode pitch and width can be maintained while reducing the spacing between adjacent electrode pairs on opposite sides of the transparent film 52 and increasing the spacing between adjacent electrode pairs on the upper side of the transparent film 52. This will have the effect of increasing the magnitude of the in-plane electric field between the electrodes on opposites sides of the transparent film 52 while reducing the in-plane electric field between the electrodes on the upper side of the transparent film 52. This is illustrated in FIGS. 12A-12B where the spacing $S_{ca}$ between conductive electrodes 50c and 50a and the spacing $S_{bc}$ between conductive electrodes 50b and 50c is reduced relative to the spacing $S_{ab}$ between conductive electrodes 50a and 50b. In a preferred configuration, the spacings are adjusted to equalize the magnitude of the in-plane electric fields between the adjacent electrode pairs. Similarly, the electrode pitch $P_e$ can be reduced while maintain the spacing $S_{ab}$ between conductive electrodes 50a and 50b on the upper side of the transparent film 52. This has the effect of reducing the spacings $S_{ab}$ and $S_{bc}$ between conductive electrodes in the interlaced pattern on the opposite sides of the transparent film. Another approach can be to increase the width of the bottom conductive electrodes 50c, thereby reducing the spacings $S_{ab}$ and $S_{bc}$ between conductive electrodes in the interlaced pattern on the opposite sides of the transparent film 52.

In some embodiments of the present invention where the conductive electrodes are on opposite sides of the transparent substrate, the conductive electrodes may be opaque, or highly-reflective. In EDS for CSP mirror applications, for example, highly-reflective conductive electrodes on a highly-transparent substrate can be used to optimize the reflection from the self-cleaning mirror. In other applications, opaque, highly reflective electrodes are undesirable due to their either visibility in consumer applications or the blocking of light for Si PV cleaning applications. In these cases, it is desirable that the overall electrode film have a high degree of transparency, including the area of the conductive electrodes.

It is desirable that the electrode film 61 have a high degree of transparency to minimize any loss in the amount of light available for solar power generation. Fabricating the conductive electrodes 50 using a transparent material such as indium tin oxide is undesirable in many applications due to its relatively high resistivity, which will limit the line widths of the electrodes. Furthermore, in display applications, the associated RC time constant will reduce the switching speed of the display "pixel". In EDS type applications, the resistive losses will result in decreasing field strength with increasing distance from the voltage connection to the bus bar and will produce resistive heating due to current flow in the electrodes.

When using opaque (or partially opaque electrodes), narrowing the width of the conductive electrodes 50 can improve the transparency, however there is a limit to how narrow they can be made without impacting the performance of the EDS. Conductive electrodes 50 that are not readily visible to a human observer, are typically between 1 to 20 μm wide, and are preferably between 1 to 10 μm wide. These very narrow lines can have a high failure rate due to defects in manufacturing or other issues. In an exemplary embodiment, the transparency of the conductive electrodes 50 is increased without having a substantial impact on device performance by using conductive electrodes 50 having a conductive mesh pattern.

It will be appreciated that the exact pattern and uniformity of the electric field on the surface of the EDS 60 may vary based on the shapes, sizes and spacing of the conductive electrodes 50a, 50b, 50c. When conductive electrodes 50a, 50b, 50c having relatively large dimensions and large inter-electrode spacing are used, the spatial distribution of the divergent electric field intensity across the surface may be quite non-uniform. As the dimensions of the conductive electrodes 50a, 50b, 50c and the inter-electrode spacing are reduced, the distribution of the divergent electric field becomes more evenly spaced across the surface of the screen. Such an even distribution of non-uniform electric field results in more uniform cleaning of the dust layer over the surface. It is desirable to minimize the ratio of surface area covered by the conductive electrodes 50a, 50b, 50c to the total area of the EDS 60 (thereby maximizing the overall transparency) and optimize the electrode geometry for the desired in-plane field strength, resulting in the maximum cleaning efficiency when used in EDS films. The thickness of the dielectric components of the final film stack, including any dielectric layers 56 and the transparent film 52 in embodiments where electrodes are formed on both sides of the substrate, can also be optimized to obtain maximum protrusion of the field lines above the surface yet providing protection of the conductive electrodes 50a, 50b, 50c against weather-related or physical degradation.

Figure 13:
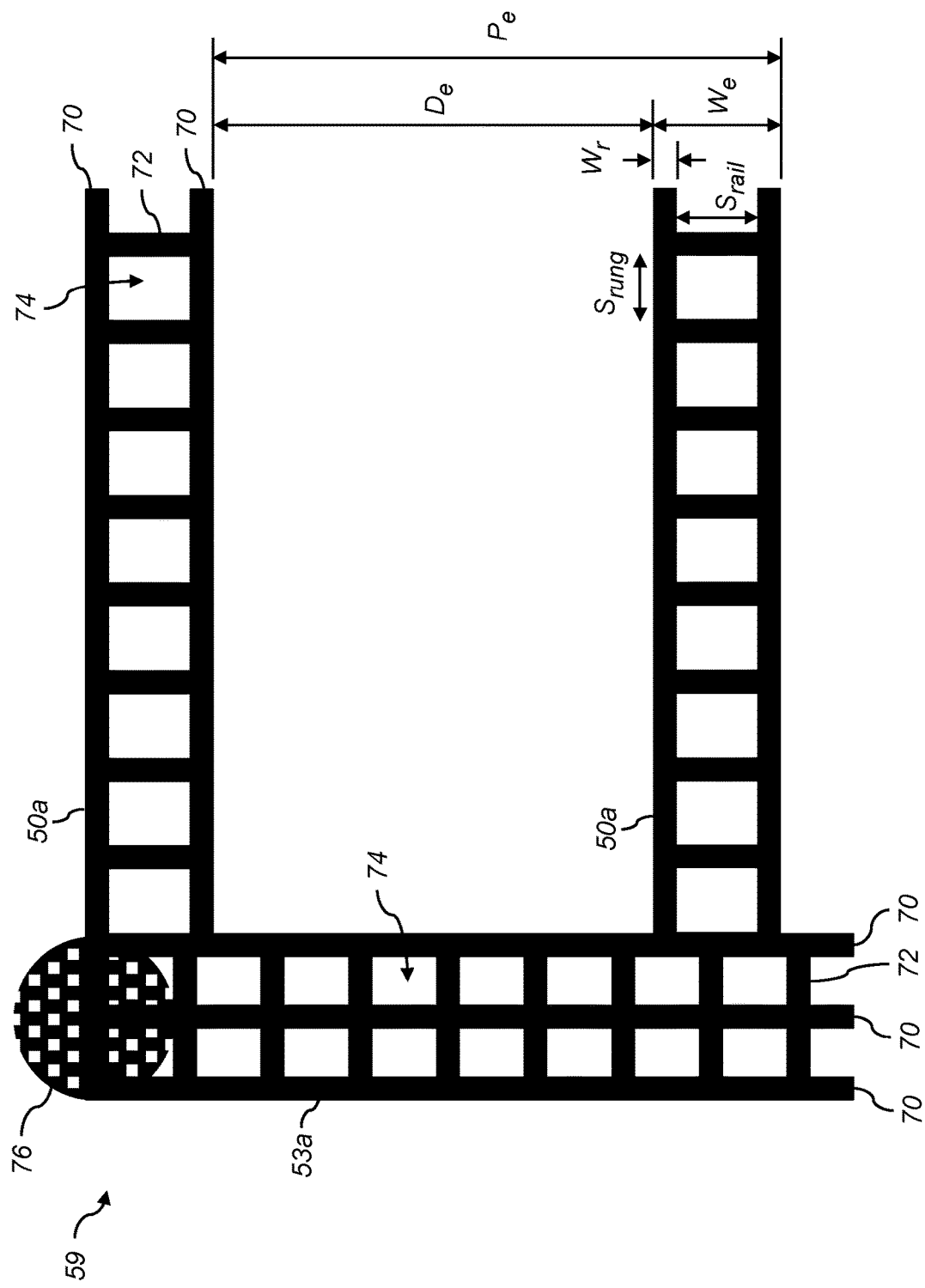
FIG. 13 is a schematic diagram illustrating conductive electrodes made with conductive mesh patterns in accordance with an exemplary embodiment.

FIG. 13 illustrates an exemplary electrode pattern 59 corresponding to a portion of the first set of conductive electrodes 50a in the upper left corner of FIG. 8A. The conductive electrodes 50a and bus bar 53a are made using conductive mesh patterns including a pattern of open areas 74. In other embodiments, the bus bar 53a is a uniform metal trace (i.e., not a mesh electrode), and is used with conductive electrodes 50a which have a mesh pattern. In the exemplary configuration of FIG. 13, the conductive mesh patterns include a plurality of rails 70 interconnected by rungs 72. In the illustrated example, the mesh pattern of the conductive electrodes 50a is made up of micro-wires including two rails 70, and the mesh pattern of the bus bar 53a includes three rails 70. However, in other embodiments, other rail/rung configuration, or other types of mesh patterns can be used. Within the context of the present disclosure, a conductive mesh pattern will be defined as a pattern of interconnected regions of conductive material interspersed with open regions with no conductive material. In a preferred embodiment, the conductive mesh pattern is such that the edges of the conductive electrodes 50a are defined by continuous micro-wires or rails 70. While the edge rails 70 are preferably continuous, there is no restriction on their shape and can be straight or curved depending on the requirements of the in-plane electric field application. When used in EDS films, the edge rails are typically linear. In general, the interior of the conductive electrodes 50a having conductive mesh patterns can include any pattern of open regions, such as the exemplary the open areas 74 formed between the rungs 72 in FIG. 13. Preferably, the conductive mesh pattern will include an inside pattern of conductive features (e.g., rungs 72) that connect the outside rails 70 to provide redundancy in case of a physical or electrical break in one of the rail 70. The pattern of rungs 72 (or other inside pattern) is optimized to maximize both transparency and redundancy protections.

While the percent area coverage of an opaque conductor in the area of the conductive electrode will determine the overall transparency, it is further desired that the dimensions of the conductive elements in the mesh pattern are minimized so as to minimize their visual impact. In preferred embodiments of the present invention the width of the rails and rungs ($W_r$) of the mesh pattern are between 1 to 20 μm wide, more preferably between 3 and 10 μm wide. To maximize the electrode transparency, the rung spacing $S_{rung}$ is optimized to be sufficiently large to maximize the open area, yet sufficient in number to provide the desired electrical robustness. In preferred embodiments the rung spacing $S_{rung}$ is at least 2 times the rail spacing $S_{rail}$, which provides the desired electrical redundancy and connections without sacrificing the open area between the rails. To minimize the impact on the average transmittance $T_a$ of the active area, the dimensions of the conductive electrodes 50a themselves also need to be controlled. In preferred embodiments, the electrode width, $W_e$, is between 10 and 200 μm, and more preferably between 30 and 150 μm.

In the illustrated configuration of FIG. 13, the conductive electrodes 50a have an electrode width $W_e$ and are separated by an electrode spacing $D_e$ so that they have an electrode pitch $P_e = D_e + W_e$. Note that the electrode pitch $P_e$ corresponds to the pitch of the conductive electrodes 50a in a single set of conductive electrodes 50a. The first set of conductive electrodes 50a will be interlaced with other sets of electrodes. In order to maintain a repeat pattern across the electrode film 61, each set of conductive electrodes 50a, 50b, 50c will have the same electrode pitch $P_e$. In cases where the electrodes are of equal width and are equally spaced, an overall electrode pitch P (i.e., the pitch between adjacent conductive electrodes 50a, 50b, 50c in the interlaced pattern) will be given by $P = P_e/N$, where N is the number of sets of interlaced electrodes. For the EDS 60 of FIG. 7A, there are three sets of equally spaced conductive electrodes 50a, 50b, 50c so that the overall electrode pitch will be $P = P_e/3$.

The rails 70 have a rail width $W_r$ and are separated by a rail spacing $S_{rail}$. In an exemplary configuration, the rungs 72 have the same width as the rails 70, although this is not a requirement. The rungs 72 are separated by a rung spacing $S_{rung}$ to form the open areas 74. The average transmittance $T_e$ of the conductive electrodes 50a (relative to the substrate) will be given by:

$$T_e = f_o \cdot T_o + f_c \cdot T_c \quad (1)$$

where $f_o$ is the fraction of the electrode area corresponding to the open areas 74, $f_c = 1 - f_o$ is the fraction of the electrode area corresponding to the conductive elements (i.e., rails 70 and rungs 72), $T_o$ is the transmittance of the open areas 74 (typically 100%), and $T_c$ is the transmittance of the conductive elements. Typically, the transmittance of the conductive elements $T_c$ will be in the range 0% (i.e., totally opaque) up to 90%. In a preferred embodiment, the conductive electrodes 50a have an average transmittance $T_e$ of at least 33%, and preferably of at least 50%, and more preferably of at least 70%. A $T_e$ of at least 33% corresponds to the embodiment where $W_r$ is equal to $S_{rail}$ (without accounting for rungs 72). In preferred embodiments, $S_{rail}$ is between 3 and 10 times $W_r$. When $S_{rail}$ is too small relative to $W_r$, then transparency is sacrificed. When $S_{rail}$ is too large relative to $W_r$, than the mesh electrode may no longer perform as well as a uniform electrode for in-plane field generation. Similarly, as noted above the preferred rung spacing $S_{rung}$ is at least 2 times the rail spacing $S_{rail}$, which provides the desired electrical redundancy and connections without sacrificing the open area between the rails. Preferred embodiment of conductive electrodes having a mesh patterns have $S_{rung}$ between 2 and 10 times that of $S_{rail}$, and more preferably between 3 and 6 times. Spacings of $S_{rung}$ greater than 10 times that of $S_{rail}$ have a minimal impact on $T_e$, and provide reduced electrical protection.

The average transmittance $T_a$ of the active area 65 of the EDS 60 (FIG. 7A) can be determined in a similar fashion:

$$T_a = (1 - f_e) \cdot T_o + f_e \cdot T_e \quad (2)$$

where $f_e$ is the fraction of the EDS 60 surface area covered by conductive electrodes 50a, 50b, 50c. In a preferred embodiment, the EDS 60 an average transmittance $T_a$ (relative to the substrate) of at least 80%, and more preferably of at least 90%. For applications where the electrodes are closely spaced, the transparency of the electrodes $T_e$ will be the dominant effect. For applications where the electrodes are widely space, the electrode spacing $D_e$ will be the dominant factor controlling the fractional area $f_e$. In most real-world applications, both $T_e$ and $D_e$ are important factors in the overall transparency of the active area.

In the illustrated configuration, the electrode pattern 59 also includes rounded exterior corners to prevent the formation of concentrated fields at sharp features. The rounded corners can be formed in any method known in the art including, but not limited to, adding circular elements 76.

Figure 14:
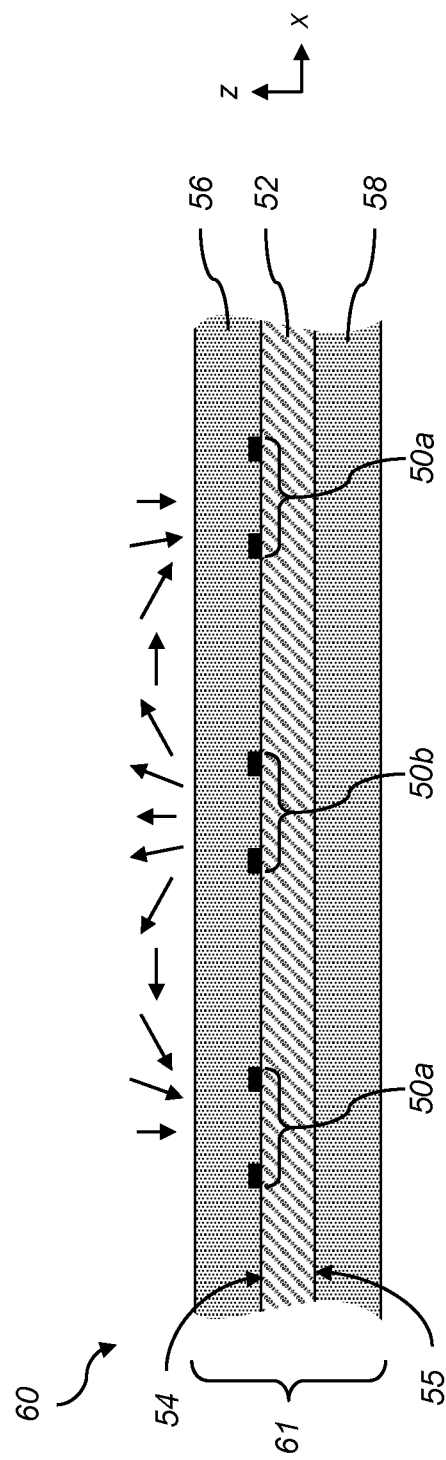
FIG. 14 illustrates an electric field pattern formed by energizing the electrodes in a single-sided electrodynamic screen similar to that of FIG. 11A where the conductive electrodes are made with conductive mesh patterns.

It has been found that the in-plane electric fields produced by conductive electrodes 50a, 50b, 50c having conductive mesh patterns have only small differences relative to those produced by solid electrodes of the same electrode width $W_e$. FIG. 14 illustrates exemplary electric field patterns formed above a surface of the electrode film 61 of a single-sided EDS 60 having an electrode pattern similar to FIG. 11A, where the conductive electrodes 50a, 50b in this case are formed with the rail/rung conductive mesh pattern of FIG. 13. It can be seen that while the electric field patterns over the top of the conductive electrodes 50a, 50b are somewhat different, the electric field patterns in the regions between the conductive electrodes 50a, 50b are almost identical to those of the solid electrode case of FIG. 11A while the transparency of the electrode film 61 is substantially higher.

The maximum electric field above mesh electrodes can be modelled as a function of electrode geometry, varying the parameters $W_e$, $W_r$, and $D_e$ shown in FIG. 13, in order to determine the field loss associated with the mesh structure as well as impact on transparency due to the % area covered by electrode structure. The 2-phase construction illustrated in FIG. 11B was modeled with the mesh electrode structures as illustrated in FIG. 13. In these examples, the electrode width $W_e$ was set at 50 μm, and the electrode spacing $D_e$ within a single electrode phase was fixed at 450 μm such that $P_e$=500 μm. The mesh electrodes were evenly spaced as shown in FIG. 11B, so that the space between adjacent electrodes in the interlaced pattern was 200 μm. Two examples were modeled, one where the rail width was $W_r$=10 μm, the other where Wr=5 μm; these results were compared to a solid electrode having a $W_e$=50 μm. The solid electrode has a transparency of $T_a$=90%, while the mesh electrodes have transparency values of $T_a$=96% when $W_r$=10 μm, and $T_a$=98% for $W_r$=5 μm with negligible loss in maximum field strength.

Working with the dimensions $W_e$, $D_e$, and $W_r$ from FIG. 13, it is possible to determine structures that will decrease the % area covered while keeping maximum field unchanged. For example, a rail/rung structure with $W_e$=150 μm, $D_e$=750 μm, and $W_r$=15 μm has an effective transparency (relative to the substrate) of $T_a$=96.7%, compared to a rail/rung structure with $W_e$=100 μm, $D_e$=850 μm, and $W_r$=10 μm, which has an effective transparency $T_a$=97.9%, and compared to a rail/rung structure with $W_e$=50 μm, $D_e$=950 μm, and $W_r$=5 μm which has an effective transparency $T_a$=99.0%, yet the maximum field strength for each of these structures is within a 5% range. Higher levels of electric field are realized by decreasing $D_e$ and $W_e$ while lower levels of area coverage (equating to higher transparency) are realized by increasing $D_e$, $W_e$, and decreasing $W_r$. Increasing $D_e$ or $W_e$ while holding the other parameters constant will decrease the area coverage while at the same time decreasing the maximum field strength.

Table 2 gives the details for ten transparent electrode films that were fabricated on PET and evaluated in EDS configurations. The active area of each film contained three electrode patterns (N=3), each having the same electrode pattern (as defined in Table 2). Two of the three electrode patterns were formed on the first surface of a 5 mil PET film, with the third electrode pattern being located on the second surface. Samples 1-2 had individual 10 micron wide solid electrodes. Samples 3-10 had mesh-patterned electrodes with 2 rails and connecting rungs. The overall yield of the solid electrode samples was poorer than that of the samples with mesh electrodes. All 10 samples were fabricated using a print and plate process as will described below relative to FIGS. 15 and 16. After being fabricated, the samples were laminated to a PV cell surface and evaluated for cleaning efficiency using the same three-phase waveform. All 10 samples performed as intended and were able to remove the dust from the EDS stack.

TABLE 2

Exemplary EDS electrode geometries.

| Sample | Elect. Type | $W_r$ (μm) | $W_e$ (μm) | Pe/N (μm) | $S_e$ (μm) | $S_{rail}$ (μm) | $S_{rung}$ (μm) | $S_{rung}/S_{rail}$ | $S_e/W_e$ | $T_e$ (%) | $T_a$ (%) |
|---|---|---|---|---|---|---|---|---|---|---|---|
| 1 | Solid | 10 | 10 | 700 | 680 | 0 | N/A | N/A | 69.0 | 0 | 98.6 |
| 2 | Solid | 10 | 10 | 1040 | 1020 | 0 | N/A | N/A | 103.0 | 0 | 99.0 |
| 3 | Mesh | 10 | 34 | 700 | 632 | 24 | 400 | 16.7 | 19.6 | 40.2 | 97.1 |
| 4 | Mesh | 10 | 34 | 1040 | 972 | 24 | 400 | 16.7 | 29.6 | 40.2 | 98.0 |
| 5 | Mesh | 14 | 70 | 700 | 560 | 56 | 400 | 7.1 | 9.0 | 58.5 | 95.8 |
| 6 | Mesh | 14 | 70 | 700 | 560 | 56 | 56 | 1.0 | 9.0 | 50.9 | 94.8 |
| 7 | Mesh | 10 | 70 | 870 | 730 | 60 | 400 | 6.7 | 11.4 | 69.7 | 97.6 |
| 8 | Mesh | 10 | 70 | 1040 | 900 | 60 | 400 | 6.7 | 13.9 | 69.7 | 98.0 |
| 9 | Mesh | 10 | 120 | 920 | 680 | 110 | 400 | 3.6 | 6.7 | 81.3 | 97.6 |
| 10 | Mesh | 10 | 120 | 1040 | 800 | 110 | 400 | 3.6 | 7.7 | 81.3 | 97.8 |

The patterns of conductive electrodes of the present invention can be fabricated using any appropriate fabrication method known in the art. Conductive electrodes 50 can be made of metal, for example a thin metal layer composed of highly conductive metals such as gold, silver, copper, or aluminum. Other conductive metals or materials can be used. Conductive electrodes 50 can be formed by patterned deposition of conductive materials or of patterned precursor materials that are subsequently processed, if necessary, to form a conductive material. Suitable methods and materials are known in the art, for example inkjet deposition or screen printing with conductive inks. Alternatively, conductive electrodes 50 can be formed by providing a blanket deposition of a conductive or precursor material and patterning and curing, if necessary, the deposited material to form conductive electrodes 50. Photo-lithographic and photographic methods are known to perform such processing. The present invention is not limited by the conductive electrodes 50 materials or by methods of forming a pattern of transparent conductive electrodes. For example, commonly-assigned U.S. Pat. No. 8,773,392 to R. Cok, entitled "Transparent touch-responsive capacitor with variable-pattern micro-wires," which is incorporated herein by reference, discloses a variety of materials and methods for forming patterned electrodes formed from micro-wires on a substrate surface.

Figure 15:
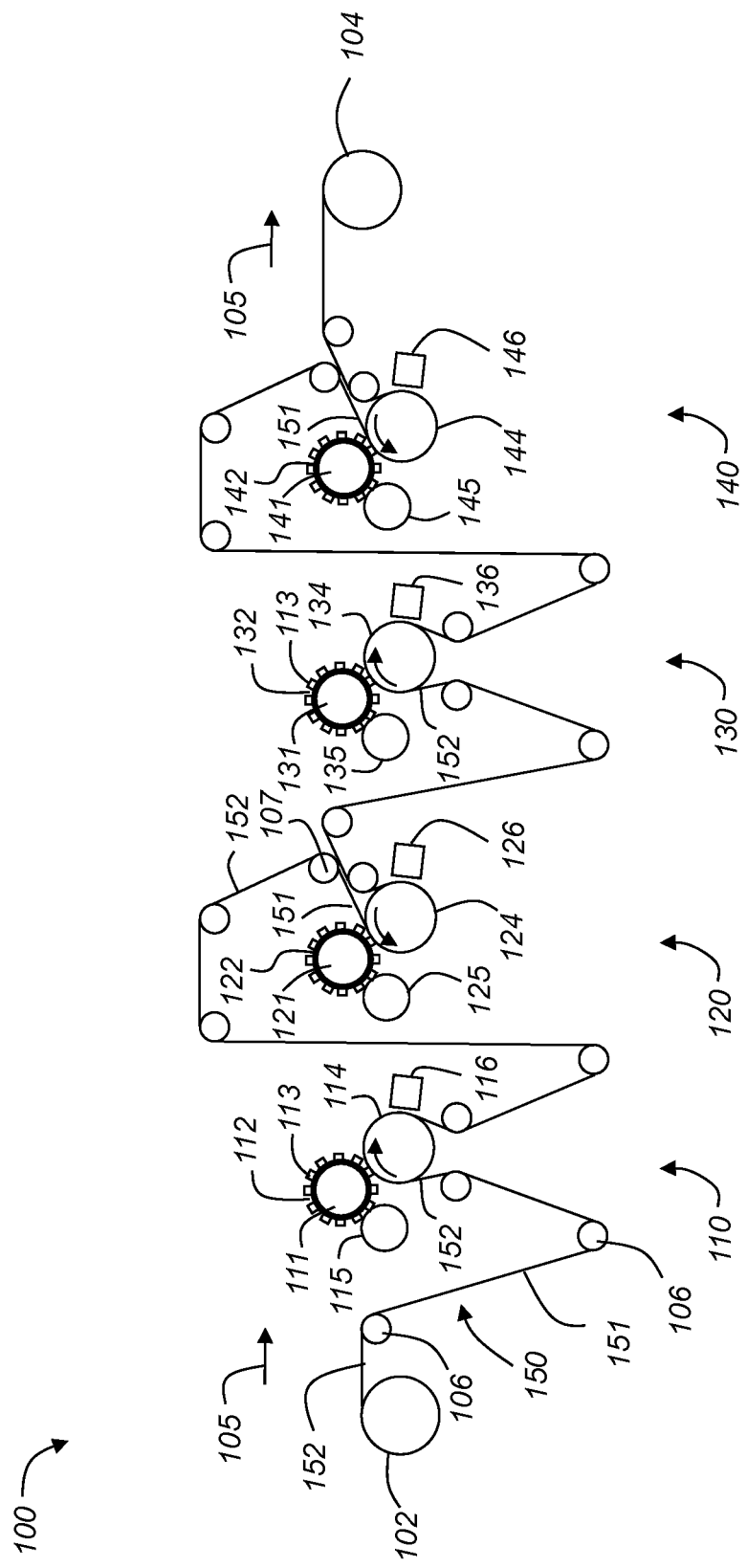
FIG. 15 is a schematic side view of an exemplary flexographic printing system for roll-to-roll printing on both sides of a substrate.

FIG. 15 is a schematic side view of a flexographic printing system 100 that can be used in some embodiments of the invention to produce patterns of conductive electrodes by roll-to-roll printing of a catalytic ink on both sides of a substrate 150 for subsequent electroless plating. In other embodiments, the flexographic printing system 100 can be used for roll-to-roll printing of a conductive ink on both sides of the substrate 150. Substrate 150 is fed as a web from supply roll 102 to take-up roll 104 through flexographic printing system 100. Substrate 150 has a first side 151 and a second side 152.

The flexographic printing system 100 includes two print modules 120 and 140 that are configured to print on the first side 151 of substrate 150, as well as two print modules 110 and 130 that are configured to print on the second side 152 of substrate 150. The web of substrate 150 travels overall in roll-to-roll direction 105 (generally left-to-right in the example of FIG. 15). However, various rollers 106 and 107 are used to locally change the direction of the web of substrate as needed for adjusting web tension, providing a buffer, and reversing the substrate 150 for printing on an opposite side. In particular, note that in print module 120, roller 107 serves to reverse the local direction of the web of substrate 150 so that it is moving substantially in a right-to-left direction.

Each of the print modules 110, 120, 130, 140 includes some similar components including a respective plate cylinder 111, 121, 131, 141, on which is mounted a respective flexographic printing plate 112, 122, 132, 142, respectively. Each flexographic printing plate 112, 122, 132, 142 has raised features 113 defining an image pattern to be printed on the substrate 150. Each print module 110, 120, 130, 140 also includes a respective impression cylinder 114, 124, 134, 144 that is configured to force a side of the substrate 150 into contact with the corresponding flexographic printing plate 112, 122, 132, 142. Impression cylinders 124 and 144 of print modules 120 and 140 (for printing on first side 151 of substrate 150) rotate counter-clockwise in the view shown in FIG. 15, while impression cylinders 114 and 134 of print modules 110 and 130 (for printing on second side 152 of substrate 150) rotate clockwise in this view.

Each print module 110, 120, 130, 140 also includes a respective anilox roller 115, 125, 135, 145 for providing ink to the corresponding flexographic printing plate 112, 122, 132, 142. As is well known in the printing industry, an anilox roller is a hard cylinder, usually constructed with a steel or aluminum core, having an outer surface containing millions of very fine dimples, known as cells. Ink is provided to the anilox roller by a tray or chambered reservoir (not shown). In some embodiments, some or all of the print modules 110, 120, 130, 140 also include respective UV curing stations 116, 126, 136, 146 for curing the printed ink on substrate 150.

In an exemplary embodiment, the print modules 120, 140 can be used to print the first and second patterns of conductive electrode 50*a*, 50*b* (FIG. 7A), respectively, on the first side 151 of the substrate 150, and the print module 110 can be used to print the third pattern of conductive electrode 50*c* (FIG. 7A) on the second side 152 of the substrate 150.

Figure 16:
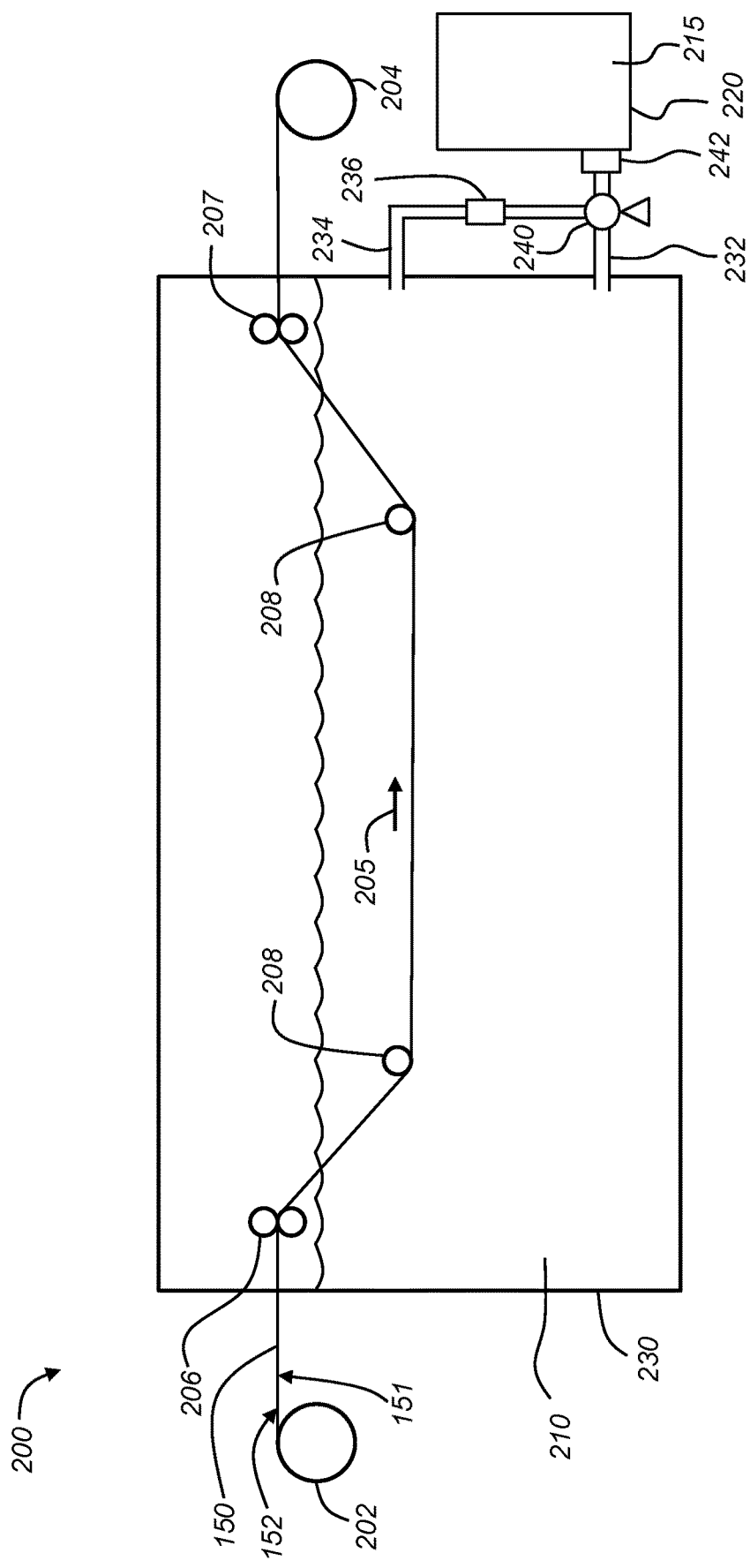
FIG. 16 is a schematic side view of an exemplary roll-to-roll electroless plating system.

FIG. 16 is a schematic side view of an exemplary roll-to-roll electroless plating system 200 disclosed in commonly-assigned, co-pending U.S. Patent Application Publication 2016/0168713 entitled "Roll-to-roll electroless plating system with liquid flow bearing," by S. Reuter et al., which is incorporated herein by reference. The roll-to-roll electroless plating system 200 includes a tank 230 of plating solution 210. A web of substrate 150 is fed by a web advance system along a web-transport path in an in-track direction 205 from a supply roll 202 to a take-up roll 204. The web of substrate 150 is a substrate upon which electroless plating is to be performed. Drive roller 206 is positioned upstream of the plating solution 210 and drive roller 207 is positioned downstream of the plating solution 210. Drive rollers 206 and 207 advance the web of substrate 150 from the supply roll 202 through the tank of plating solution 210 to the take-up roll 204. Web-guiding rollers 208 are at least partially submerged in the plating solution 210 in the tank 230 and guide the web of substrate 150 along the web-transport path in the in-track direction 205.

As the web of substrate 150 is advanced through the plating solution 210 in the tank 230, a metallic plating substance such as copper, silver, gold, nickel or palladium is electrolessly plated from the plating solution 210 onto predetermined locations on one or both of a first surface 151 and a second surface 152 of the web of substrate 150. As a result, the concentration of the metal or other components in the plating solution 210 in the tank 230 decreases and the plating solution 210 needs to be refreshed. To refresh the plating solution 210, it is recirculated by pump 240, and replenished plating solution 215 from a reservoir 220 is added under the control of controller 242, which can include a valve (not shown). In the example shown in FIG. 16, plating solution 210 is moved from tank 230 to pump 240 through a drain pipe 232 and is returned from pump 240 to tank 230 through a return pipe 234. In order to remove particulates from plating solution 210, a filter 236 can be included, typically downstream of the pump 240.

In a preferred embodiment, patterns of conductive electrodes for providing in-plane electric fields are fabricated by using a printing press, such as the flexographic printing system 100 of FIG. 15, to print a pattern of catalytic ink on the first and second surfaces 151, 152 of the substrate 150, and then using a roll-to-roll electroless plating system 200 (FIG. 12) to plate a layer of metal over the catalytic ink. However, it will be clear to one skilled in the art that the patterns of conductive electrodes can be formed using any of a wide variety of methods known in the art. For example, a gravure printing press can be used instead of the flexographic printing system 100. In some embodiments, patterns of conductive electrodes can be formed directly by printing a pattern of conductive ink. In other embodiments, patterns of conductive electrodes can be formed using an imprint and fill technique such as that disclosed in commonly-assigned U.S. Pat. No. 8,865,292 to Trauernicht et al., entitled "Micro-channel structure for micro-wires."

The ink that is used in the flexographic printing system 100 shown in FIG. 15 remains on the substrate 150 even after electroless plating. The ink contains metal particles, such as silver nanoparticles, that act as nucleation sites for the electroless plating process. In some embodiments, the ink can also contain pigment particles that cause the printed ink pattern to have a matte neutral color. The printed ink pattern will still be visible when viewing the EDS from the first side 151 of the substrate 150 so that it will appear to have a matte neutral color. In some configurations, after plating the ink with a metal such as copper, the substrate 150 with the microwires can be put through a second bath to apply a darkening agent. In an exemplary configuration, palladium is used as a darkening agent. This darkening agent covers the second side of the plated metal microwires as well as the edges of the microwires as they are also exposed to the bath with the darkening agent. Both the darkening agent and the ink with the pigment particles that cover the metal wires have the beneficial effect of creating a neutral color and reducing reflection and glint off the metallic surfaces of the microwires when they are viewed from the second side 152 of the substrate 150.

In the above exemplary embodiments, the present invention is applied to patterns of electrodes which produce in-plane electric fields in transparent electrodynamic screens (EDS) for protecting solar panels and solar concentrators using automatic and efficient dust removal. The disclosed electrodynamic screens include arrays of parallel electrodes on surfaces of a transparent dielectric film. When the electrodes are activated by phased voltage, the dust particles on the surface of the film become electrostatically charged and are removed by the alternating electric field. It has been found that over 90% of deposited dust can be removed within minutes, using a very small fraction of the energy produced by the panels. No water or mechanical action is involved. Also described are processes for manufacturing self-cleaning solar panels and concentrators, with emphasis on scalability, durability and on large-scale production cost. The electrodynamic screens are appropriate for retrofitting existing solar PV and PT plants, and for manufacturing solar panels and solar concentrator components (e.g., mirrors, lenses, and glass envelopes of the central receivers) with integrated EDS.

In one aspect, an electrode film assembly is disclosed that is usable to self-remove particles of material such as dust deposited thereon. The film assembly includes a transparent film and a set of elongated conductive electrodes carried by the film. The electrodes are configured to be connected to a source of pulsed electrical power and to generate an in-plane electric field above a surface of the film in response to the pulsed electrical power. The electric field is of sufficient strength to remove the particles from the surface. The electrodes are separated from adjacent components by a protective layer of a dielectric material having substantially higher dielectric strength than a dielectric strength of the film to protect the film from dielectric breakdown during operation. In one embodiment the protective layer is a coating of $SiO_2$ material.

In exemplary embodiments, the electrode film assembly, incorporated with EDS is placed over the solar collector components (PV modules, lenses, parabolic troughs, mirrors) forming part of a solar energy system. In some embodiments, the EDS film can have a self-adhesive backing with pressure sensitive adhesive (PSA), such as Silgrip PSA 518, that would allow placement of the film on the PV module surface for self-cleaning action. Application of a vacuum lamination process provides an efficient method for retrofitting the EDS films. Production of such a film will make the transparent EDS application versatile and attractive for both new and existing PV modules; the electrode film will be replaceable in cases where there is any environmental degradation of the electrode film. In use, the electrode film assembly is connected to a pulsed power supply that provides the pulsed electrical power to the film assembly of each of the solar energy panels of the system. The pulsed electrical power has voltage amplitude sufficiently high to cause the electric field to be of sufficient strength to remove the particles from the surface of the film of the film assembly of each of the solar energy components during operation.

In other embodiments, the patterns of conductive electrodes are used to generate electric field patterns across the surface of a transparent film for other applications. As discussed above, in-plane fields are useful for display applications, such as electrophoretic displays or LCDs, as well as for use in smart windows. In these applications, there may be multiple pairs of conductive electrodes to produce localized fields, for example at a display pixel electrode level. These electrodes are connected to a power source to supply the required waveforms to generate a time-varying electric field above a surface of the electrode film, the surface being a localized area such as a pixel.

The invention has been described in detail with particular reference to certain preferred embodiments thereof, but it will be understood that variations and modifications can be effected within the spirit and scope of the invention.

PARTS LIST 10 conductive electrode
10a conductive electrode
10b conductive electrode
10c conductive electrode
10n conductive electrode
10p conductive electrode
11 film assembly
12 dielectric film
13a bus bar
13b bus bar
13c bus bar
13n bus bar
13p bus bar
14 single-phase pulsed power source
15 insulating pads
16 three-phase pulsed power source
18 electrodynamic screen (EDS)
20 solar panel
22 planoconvex lens
24 transparent film
26 protective layer
28 cover glass plate
30 semiconducting film
32 current collecting grids
34 back plate
36 solar concentrator mirror
38 cover glass plate
40 silver coating
50 conductive electrode
50a conductive electrode
50b conductive electrode
50c conductive electrode
50d conductive electrode
51 cut-line
52 transparent film
53a bus bar
53b bus bar
53c bus bar
53d bus bar
54 first side
55 second side
56 layer
58 layer
59 electrode pattern
60 electrodynamic screen (EDS)
61 electrode film
65 active area
70 rail
72 rung
74 open area
76 circular element
100 flexographic printing system
102 supply roll
104 take-up roll
105 roll-to-roll direction
106 roller
107 roller
110 print module
111 plate cylinder
112 flexographic printing plate
113 raised features
114 impression cylinder
115 anilox roller
116 UV curing station
120 print module
121 plate cylinder
122 flexographic printing plate
124 impression cylinder
125 anilox roller 126 UV curing station
130 print module
131 plate cylinder
132 flexographic printing plate
134 impression cylinder
135 anilox roller
136 UV curing station
140 print module
141 plate cylinder
142 flexographic printing plate
144 impression cylinder
145 anilox roller
146 UV curing station
150 substrate
151 first side
152 second side
200 roll-to-roll electroless plating system
202 supply roll
204 take-up roll
205 in-track direction
206 drive roller
207 drive roller
208 web-guiding roller
210 plating solution
215 replenished plating solution
220 reservoir
230 tank
232 drain pipe
234 return pipe
236 filter
240 pump
242 controller

The invention claimed is:

1. An electrode film, comprising:
a transparent film of dielectric material;
a first electrode pattern disposed on a surface of the transparent film including a first set of parallel conductive electrodes connected to a first bus, wherein the electrodes in the first set of parallel conductive electrodes have a first electrode width and a first electrode spacing, wherein the first electrode spacing is a distance between adjacent electrodes in the first set of parallel conductive electrodes, and wherein the first electrode spacing is between five times and 90 times that of the first electrode width;
a second electrode pattern disposed on the surface of the transparent film including a second set of parallel conductive electrodes connected to a second bus, wherein the electrodes in the second set of parallel conductive electrodes have a second electrode width and a second electrode spacing, wherein the second electrode spacing is a distance between adjacent electrodes in the second set of parallel conductive electrodes, and wherein the second electrode spacing is between five times and 90 times that of the second electrode width;
wherein the first and second sets of parallel conductive electrodes are arranged in an interlaced pattern;
wherein the conductive electrodes in the first and second electrode patterns are conductive mesh patterns including a pattern of open areas so that a transparency of each of the conductive electrodes is between 33% and 70%; and
wherein the first and second buses are configured to be connected to respective sources of electrical power supplying respective waveforms to generate a time-varying electric field pattern above a surface of the electrode film.

2. The electrode film of claim 1, wherein the electrode film is a component of an electrodynamic screen system usable to self-remove particles of material deposited thereon.

3. The electrode film of claim 1, wherein the width of the parallel conductive electrodes in the first and second electrode patterns is between 30 μm and 150 μm.

4. The electrode film of claim 1, wherein the conductive mesh patterns of the first and second electrode patterns include a plurality of parallel rails interconnected by a pattern of rungs.

5. The electrode film of claim 4, wherein a width of the rails is between 1 μm and 20 μm.

6. The electrode film of claim 4, wherein a spacing between the rungs is at least 2×larger than a spacing between the rails.

7. The electrode film of claim 1, wherein the conductive electrodes in the first and second electrode patterns are a metallic material electrolessly plated over a printed catalytic ink.

8. The electrode film of claim 1, wherein the conductive electrodes in the first and second electrode patterns are a printed conductive ink.

9. The electrode film of claim 1, wherein the conductive electrodes in the first and second electrode patterns are over the surface of the transparent film.

10. The electrode film of claim 1, wherein the conductive electrodes in the first and second electrode patterns are embedded into the surface of the transparent film.

11. The electrode film of claim 1, wherein the transparent film is a polymeric film or a glass film.

12. The electrode film of claim 1, further including a layer of a dielectric material disposed over the conductive electrodes of the first and second electrode patterns on the surface of the transparent film.

13. The electrode film of claim 1, wherein the electrode film is disposed over a surface of a solar panel.

14. The electrode film of claim 1, wherein the electrode film is disposed over a surface of a solar concentrator element.

15. The electrode film of claim 1, wherein the electrode film is disposed over a surface of a window.

16. An electrical device for generating an electric field pattern above a surface of a transparent film of dielectric material, comprising:
a first set of conductive electrodes on a surface of the transparent film, wherein the electrodes in the first set of conductive electrodes have a first electrode width and a first electrode spacing, wherein the first electrode spacing is a distance between adjacent electrodes in the first set of conductive electrodes, and wherein the first electrode spacing is between five times and 90 times that of the first electrode width;
a second set of conductive electrodes on the surface of the transparent film, wherein the second set of conductive electrodes is spaced apart from the first set of conductive electrodes by an electrode spacing, wherein the electrodes in the second set of conductive electrodes have a second electrode width and a second electrode spacing, wherein the second electrode spacing is a distance between adjacent electrodes in the second set of conductive electrodes, and wherein the second electrode spacing is between five times and 90 times that of the second electrode width;

wherein the first and second sets of conductive electrodes are configured to be connected to respective sources of electrical power supplying respective waveforms to generate an electric field pattern above a surface of the transparent film; and wherein the first and second sets of conductive electrodes are conductive mesh patterns including a pattern of open areas so that the transparency of each of the conductive electrodes is between 33% and 70%.

17. The electrical device of claim 16, wherein the first set of conductive electrodes is parallel to the second set of conductive electrodes.

\* \* \* \* \*